United States Patent
Mine et al.

(10) Patent No.: US 7,906,834 B2
(45) Date of Patent: Mar. 15, 2011

(54) DISPLAY DEVICE HAVING THIN FILM SEMICONDUCTOR DEVICE AND MANUFACTURING METHOD OF THIN FILM SEMICONDUCTOR DEVICE

(75) Inventors: Toshiyuki Mine, Fussa (JP); Mitsuharu Tai, Kokubunji (JP); Akio Shima, Hino (JP)

(73) Assignee: Hitachi Displays, Ltd., Tokyo (JP)

( * ) Notice: Subject to any disclaimer, the term of this patent is extended or adjusted under 35 U.S.C. 154(b) by 187 days.

(21) Appl. No.: 12/219,837

(22) Filed: Jul. 29, 2008

(65) Prior Publication Data

US 2009/0085042 A1    Apr. 2, 2009

(30) Foreign Application Priority Data

Sep. 27, 2007  (JP) ................. 2007-251245

(51) Int. Cl.
*H01L 23/552* (2006.01)
(52) U.S. Cl. .......... 257/659; 257/59; 257/288; 257/347; 257/E21.006; 257/E21.051; 257/E21.054; 257/E21.17; 257/E21.4; 257/E21.229; 257/E21.311; 257/E21.329; 257/E21.347; 257/E21.134; 257/E21.248; 257/E21.267
(58) Field of Classification Search ............ 257/59, 257/63, 88, 79, 192, 347, 292, 428, 288, 257/659, E21.006, E21.17, E21.051, E21.054, E21.248, E21.229, E21.267, E21.329, E21.347, E21.311
See application file for complete search history.

(56) References Cited

U.S. PATENT DOCUMENTS

| 5,637,187 | A | * | 6/1997 | Takasu et al. | 438/30 |
| 6,067,062 | A | * | 5/2000 | Takasu et al. | 345/87 |
| 2008/0308143 | A1 | * | 12/2008 | Atanackovic | 136/255 |

FOREIGN PATENT DOCUMENTS

| WO | WO 97/22141 | 12/1995 |
| WO | WO 97/22142 | 8/1996 |

* cited by examiner

*Primary Examiner* — David Nhu
(74) *Attorney, Agent, or Firm* — Stites & Harbison PLLC; Juan Carlos A. Marquez, Esq.

(57) ABSTRACT

A display device having a thin film semiconductor device including a semiconductor thin film having first and second semiconductor regions formed each into a predetermined shape above an insulative substrate, a conductor fabricated into a predetermined shape to the semiconductor thin film and a dielectric film put between the semiconductor thin film and the conductor, in which the semiconductor thin film is a polycrystal thin film with the crystallization ratio thereof exceeding 90% and the difference of unevenness on the surface of the semiconductor thin film does not exceed 10 nm.

8 Claims, 21 Drawing Sheets

CARBONIC ACID GAS LASER

CARBONIC ACID GAS LASER
UV-IRRADIATION

| | CRYSTALLIZATION RATIO | SURFACE UNEVENNESS | MOBILITY |
|---|---|---|---|
| LAMP HEATING | UP TO 75% | 10 nm OR LESS | 1 cm²/V·s OR LESS |
| XeCl LASER | 90% OR MORE | 30 nm OR MORE | 50 cm²/V·s OR MORE |
| CO₂ LASER | 90% OR MORE | 10 nm OR LESS | 10 cm²/V·s OR MORE |

FIG. 10

| | LOWER LAYER Si OXIDE FILM (nm) | AMORPHOUS Si FILM (nm) | UPPER LAYER Si OXIDE FILM (nm) |
|---|---|---|---|
| SPECIMEN #1 | 120 | 60 | 120 |
| SPECIMEN #2 | 120 | 60 | 100 |
| SPECIMEN #3 | 120 | 60 | 80 |
| SPECIMEN #4 | 100 | 60 | 120 |
| SPECIMEN #5 | 100 | 60 | 100 |
| SPECIMEN #6 | 100 | 60 | 80 |
| SPECIMEN #7 | 80 | 60 | 120 |
| SPECIMEN #8 | 80 | 60 | 100 |
| SPECIMEN #9 | 80 | 60 | 80 |

P+ ION IMPLANTATION

FIG. 12

|  | SHEET RESISTANCE AVERAGE VALUE | VARIATION WITH IN WAFER | VARIATION BETWEEN WAFERS (%) |
|---|---|---|---|
| LAMP HEATING | 1800 Ω/□ | 6 - 8% | UP TO 10% |
| XeCl LASER | 600 Ω/□ | 8 - 10% | UP TO 18% |
| $CO_2$ LASER | 550 Ω/□ | 3 - 4% | UP TO 5% |

FIG. 13

|  | CRYSTALLIZATION OF CHANNEL LAYER | ACTIVATING OF DIFFUSION LAYER |
|---|---|---|
| SPECIMEN #1 | XeCl LASER | LAMP HEATING |
| SPECIMEN #2 | $CO_2$ LASER | LAMP HEATING |
| SPECIMEN #3 | $CO_2$ LASER | $CO_2$ LASER |

FIG. 18

|  | SHEET RESISTANCE | AVERAGE VALUE OF DIELECTRIC BREAKDOWN | VARIATION OF DIELECTRIC BREAKDOWN (%) |
|---|---|---|---|
| SPECIMEN #1 | 1.6k ± 0.25k Ω / □ | 7.5MV/cm | UP TO 20% |
| SPECIMEN #2 | 1.8k ± 0.1k Ω / □ | 9.8MV/cm | UP TO 5% |
| SPECIMEN #3 | 0.65k ± 0.1k Ω / □ | 9.8MV/cm | UP TO 5% |

DISPLAY DEVICE HAVING THIN FILM SEMICONDUCTOR DEVICE AND MANUFACTURING METHOD OF THIN FILM SEMICONDUCTOR DEVICE

CLAIM OF PRIORITY

The present application claims priority from Japanese patent application JP 2007-251245 filed on Sep. 27, 2007, the content of which is hereby incorporated by reference into this application.

FIELD OF THE INVENTION

The present invention concerns a display device having a liquid crystal device or an organic electroluminescence device and, particularly, it relates to an active matrix type display device having a highly reliable thin film semiconductor device that can operate at low voltage and high speed, as well as a manufacturing method of the thin film semiconductor device.

BACKGROUND OF THE INVENTION

Recently, in active matrix type liquid crystal display devices (LCD) using thin film transistors (TFT), increase in size of the screen and high resolution power have proceeded rapidly. LCDs are generally classified into amorphous Si-TFT using amorphous silicon (a-Si) as an active layer and a polycrystal Si-TFT using polycrystal Si as an active layer, in which the former has been commercialized to products mainly as large-scaled television sets taking advantage of reduced cost and the latter has been commercialized to products mainly as medium-to-small sized displays taking advantage of high resolution and high speed operation. Particularly, in the polycrystal crystal Si-TFT of high mobility (carrier mobility, hereinafter simply referred to as mobility), investigation has been promoted on reduction in cost and improvement in reliability with an aim of application to organic electroluminescence (organic EL) display devices.

The method concerned with the active layer of the polycrystal Si-TFT includes a method of forming a polycrystal Si film in the process for film formation and a method of forming an amorphous Si film and then crystallizing the amorphous Si film by using lamp overheating or laser, thereby modifying the film to a polycrystal Si film. Since the film is formed on an inexpensive and less heat resistant glass substrate in either method, it requires a processing temperature of about 500° C. or lower. As the method of crystallizing the amorphous Si film, a crystallization method by laser annealing providing high throughput and less warping of the glass substrate is predominant. Further, flexible display devices having a polycrystal Si-TFT fabricated on a resin substrate or a resin film have also been developed vigorously in recent years.

The laser annealing method used for crystallization of the amorphous Si film includes those disclosed in WO97/22141 and WO97/22142.

The outline for the process of crystallization method by laser annealing disclosed in WO97/22142 is to be described below.

(1) An amorphous Si film with a thickness of about 60 nm to about 130 nm is formed by a plasma CVD method.
(2) The amorphous Si film is crystallized under the following conditions.
(2-1) The substrate temperature in laser irradiation is controlled to a temperature from about room temperature (25° C.) to about 400° C.
(2-2) The laser irradiation time is controlled within about 10 ms for an identical portion of the film (semiconductor film).
(2-3) The laser irradiation energy is controlled to 1000 mJ/cm$^2$ or less.
(2-4) The laser oscillation source has no restriction and crystallization is conducted by using lasers such as excimer laser (ArF, XeCl, XeF, KrF), YAG laser, Ar laser, dye laser, and carbonic acid gas laser.
(3) After forming a gate insulator and a gate electrode, the gate electrode is fabricated.
(4) Impurities are implanted to source and drain regions by an ion implantation method at a temperature of 350° C. or lower.
(5) A interconnection layer is formed.

SUMMARY OF THE INVENTION

In the laser annealing for an Si film of an active matrix type display device at high reliability capable of high speed operation, a laser light at a wavelength absorbed by an Si film is irradiated and the Si film is melted and solidified to conduct crystallization. A method of using a laser light at a wavelength (wavelength about 800 nm or less) having an energy higher than the band gap of the Si film (1.1 eV) is general and a crystallization method of using an excimer laser (wavelength: 150 to 350 nm) or second harmonics of YAG layer (wavelength: 514 nm) are predominant for mass production.

The gas laser typically represented by the excimer laser involves problems in view of device that the power density on the oscillation side varies greatly to the power density of the laser to be used, and the gas is exchange frequently is high to increase the cost. Since the power density varies greatly, this results in a problem of increasing the variation of the mobility depending on the irradiation position not only between glass substrates but also within an identical substrate.

On the other hand, the solid laser typically represented by YAG laser involves a problem in view of the device that the region to be irradiated is extremely small since the power density on the oscillation side is low. When compared with the irradiation area of the gas laser, it is different by about 3 to 4 digits, and this results in a significant problem in the throughput in view of application to a large size glass substrate.

The excimer laser or YAG laser has an advantage of improving uniformness for the quality of the polycrystal Si film when a glass substrate is overheated. However, in the overheating of the glass substrate, since the heat conductivity of glass is small, heating time and cooling time are increased to remarkably lower the throughput, and the constitution of the device is complicated when cooling or heating mechanism is provided additionally to remarkably increase the initial investment cost or maintenance cost and, accordingly, laser irradiation is usually conducted at a room temperature.

In a case of intending for application to a resin substrate or the like having lower heat resistance compared with the glass substrate, it is actually difficult for substrate heating. With the view point described above, it has been strongly demanded to conduct laser irradiation at a room temperature.

In the laser annealing described in WO97/22142, laser annealing other than carbonic acid gas laser adopts a method of crystallization by melting at least a portion of the amorphous Si film and has an advantage of less defects in the Si grain boundary and obtainability of a polycrystal Si film of high mobility. However, it involves a significant problem as shown below.

FIG. 25 shows a schematic view for a crystallization of an amorphous Si film 802 by laser annealing (for example, XeCl excimer laser). After forming an amorphous Si film 802 on a glass substrate 801, a low temperature annealing (about 500° C.) of withdrawing hydrogen in the film is conducted (FIG. 25A). Then, an excimer laser is irradiated to crystallize the amorphous Si film 802. FIG. 25B is a schematic view for the initial stage of laser irradiation and FIG. 25C shows a schematic view at the final stage of laser irradiation. Actually, the irradiation time of the laser is 100 nano-seconds or less and it may be considered that FIG. 25B and FIG. 25C occur substantially simultaneously. Since a light such as an excimer laser at a wavelength of 400 nm or less has a large absorption coefficient, almost of light is absorbed near the surface of the Si film. Accordingly, as shown in FIG. 25B, in the initial process of the laser irradiation, the upper layer forms a molten liquid Si phase 803, and a lower layer forms an amorphous Si film 802.

As shown in FIG. 25C, the amorphous SI film 802 in the lower layer is crystallized with lapse of time by heat conduction to form a polycrystal Si film 804. When the laser irradiation is completed, as shown in FIG. 25D, the liquid phase Si film 803 on the side of the surface is solidified to form the polycrystal Si film 804. The solidifying process involves a drawback that steep protrusions 806 are formed at crystal grain boundaries 805 since the process is accompanied by volumic expansion from the liquid phase to the solid phase.

While the height of the protrusion 806 formed at the grain boundary 805 of the Si film depends on the condition of the laser annealing, protrusions 806 each of a size from about one-half to about entirely of the Si film thickness that undergoes crystallization under the condition of obtaining a mobility of about 10 $cm^2/V \cdot s$ or more. The portion of the production 806 results in a phenomenon that the electric field is concentrated only to the localized region of the gate insulator to be formed thereabove. The concentration of the electric field due to the protrusion 806 not only degrades the long time reliability of the polycrystal Si-TFT but also induces a failure that the gate insulator suffers from dielectric breakdown by the charge up in the process generated during the LCD manufacturing process. In a case of using other laser annealing than the carbonic acid gas laser, reduction in the thickness of the gate insulator has become extremely difficult due to the problem described above, which results in a significant trouble for the improvement of the polycrystalline Si-TFT characteristics.

On the other hand, among the laser annealing described in WO97/22142, only in the carbonic acid gas laser, the amorphous Si film is crystallized by a principle different from other laser annealing. The wavelength of the carbonic acid gas laser is 10.64 micrometer (μm) and the energy thereof is 0.116 eV, which is smaller by about one digit than the Si band gap. That is, almost of irradiated carbonic acid gas laser transmits the amorphous Si film and scarcely causes heat generation due to absorption of the laser light.

While WO97/22142 does not specifically describe the carbonic acid gas laser, we have made detailed investigations on the crystallization method of the amorphous Si film using the carbonic acid gas laser to obtain the following results.
(1) Even when the carbonic acid gas laser is irradiated at a room temperature, the amorphous Si film is not crystallized.
(2) When the substrate is heated to a temperature of about 250° C. or higher, the amorphous Si film is crystallized.
(3) Also in a case of overheating the substrate to a temperature of about 250° C. or higher, the amorphous Si film is not crystallized unless the laser power density is increased to about 50 $J/cm^2$ or higher.
(4) In a case of crystallization by using the carbonic acid gas laser, when crystallization is conducted at a temperature where Si is not melted, protrusions formed at the grain boundaries are extremely small.

As has been described above, in our investigation, it has been found that while crystallization of the amorphous Si film by the carbonic acid gas laser has an advantage that protrusions formed at the grain boundary are extremely small, but crystallization cannot be obtained unless the glass substrate is heated to a temperature of about 250° C. or higher.

The present invention intends to provide an active matrix type display device using a thin film semiconductor device at high reliability capable of high speed operation and a manufacturing method of the thin film semiconductor device. That is, the invention intends to provide a method of crystallizing by laser annealing an amorphous Si film with the mobility of an Si film of 10 $cm^2/V \cdot s$ or more and with extremely small protrusion at a grain boundary portion suitable to configuration of an active matrix type display device. The invention particularly intends to provide a crystallization method by a carbonic acid gas laser annealing not requiring heating of a substrate to a high temperature and not lowering a laser annealing throughput. Further, the invention intends to provide an active matrix type display device including a thin film semiconductor device such as a polycrystal Si TFT that can be manufactured also on a resin substrate or a resin film with low heat resistance.

In the crystallizing treatment by laser annealing other than carbonic acid gas laser, a material to be heated directly absorbs a light to generate heat (heating), but free carriers of a material to be heated are excited to heat the material to be heated in the carbonic acid gas laser. Accordingly, heating does not occur in a state where free carriers are not present or contained by an extremely small amount in the material to be heated.

For calculating the free carrier concentration necessary for increasing the substrate temperature by using the carbonic acid gas laser, the present inventors have made the following investigation. At first, phosphorus (P) was implanted to a region from the surface of a single crystal Si substrate to 1 μm depth (hereinafter referred to as a well region) by an ion implantation method. In this case, the implantation energy and the dose of phosphorus were controlled such that the phosphorous concentration in the well region was at a concentration of $1e16/cm^3$ to $3e19/cm^3$. Then, after making the distribution of the impurity concentration uniform in the well region by conducting annealing for crystallization at 1000° C. for 2 hours, a carbonic acid gas laser was irradiated under the condition not applying substrate heating and the temperature was measured by a radiation thermometer.

FIG. 23 is a graph showing a relation between the impurity concentration (phosphorus concentration) and the temperature of an Si substrate (well region) measured by a radiation thermometer. The irradiation energy of the carbonic acid gas laser is 160 $J/cm^2$. As can be seen from FIG. 23, the temperature of the Si substrate by the radiation thermometer scarcely increased in a low density region of the impurity concentration of the Si substrate of about $3e17/cm^3$ or less but the temperature increased abruptly in a region at the impurity concentration of about $1e18/cm^3$ or more. While an example of a donor type impurity of implanting phosphorus (P) is shown, the result was similar also in a case of implanting arsenic (As). Further, a similar effect was obtained also in an acceptor type impurity such as boron (B).

As has been described above, free carries of about 1e18/ $cm^3$ or more are necessary for heating of Si by the carbonic acid gas laser and it was found that high temperature heating of Si not containing the impurity was difficult in a circumstance not conducting heating for the substrate.

The present inventors made investigation on the light irradiation as another method of generating free carriers based on the result described above. A heating experiment of Si by the carbonic acid gas laser was conducted while irradiating a light by using a specimen of a structure identical with that of the experiment described above. In this case, a UV light (ultraviolet light) was used as a light source. FIG. 24 shows the result. It was found that the Si substrate was heated without overheating the substrate when UV irradiation was conducted. In this case, since the irradiation energy of the carbonic acid gas laser was made constant at 160 $J/cm^2$, a temperature of about 1200° C. was shown but the saturation temperature of the Si substrate could be controlled optionally by adjusting the irradiation energy.

According to the invention, an amorphous Si film formed on a dielectric substrate such as a glass substrate, a resin substrate, or a resin film is crystallized by carbonic acid gas laser irradiation without overheating the substrate. Alternatively, source and drain region of a polycrystal Si-TFT formed on a dielectric substrate such as a glass substrate, a resin substrate, or a resin film is activated by using a carbonic acid gas laser without heating the substrate. Specifically, a light at a wavelength absorbed by Si is irradiated to a region for irradiating a carbonic acid gas laser to generate electrons and holes. It is not necessary that the irradiated light is at a single wavelength as a laser but may be any light that increases the density of free carrier (electrons, holes) to about $1e18/cm^3$ or higher in a region irradiated with the carbonic acid gas laser. Also, the material crystallized or activated by the carbonic acid gas laser is not restricted to Si, but it may be a mixed crystal material such as SiGe or SiC.

Advantageous effects obtained by typical aspects of the invention disclosed in the present application are to be described below simply.

Crystallization of a semiconductor thin film or activation of an impurity is enabled by using a carbonic acid gas laser without heating the substrate. Specifically, amorphous Si film, amorphous SiGe film, or amorphous SiC film, etc. can be crystallized and impurities contained therein can be activated.

This enables to provide a polycrystalline semiconductor thin film with an extremely planar surface to improve the dielectric resistance and the reliability of dielectric film formed thereon. Further, activation ratio of impurity and uniformity thereof is improved remarkably.

BRIEF DESCRIPTION OF THE DRAWINGS

FIG. 10 is a comparative view of the structure for a specimen for explaining embodiment 4 of the invention;

FIG. 12 is a comparative view for the result of measurement for explaining embodiment 4 of the invention;

FIG. 13 is a comparative view for a manufacturing method of specimens for explaining embodiment 5 of the invention;

FIG. 18 is a comparative view for the result of measurement for explaining embodiment 5 of the invention;

DETAILED DESCRIPTION OF THE PREFERRED EMBODIMENTS

Figure 1A:
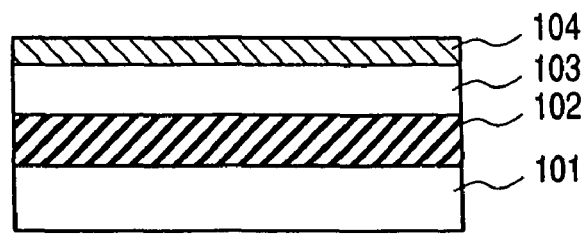
FIG. 1A, FIG. 1B, and FIG. 1C are cross sectional views of a specimen explaining embodiment 1 of the invention.

Preferred embodiments of the invention are to be described specifically by way of examples with reference to the drawings. Those having identical functions carry same reference numerals throughout the drawings of the examples for explaining the preferred embodiments, for which duplicate descriptions are to be omitted.

Embodiment 1

Figure 1B:
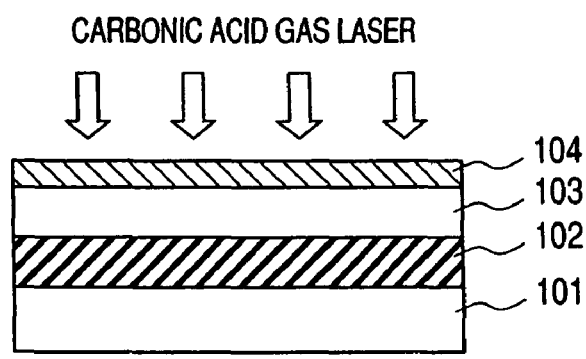
Figure 1C:
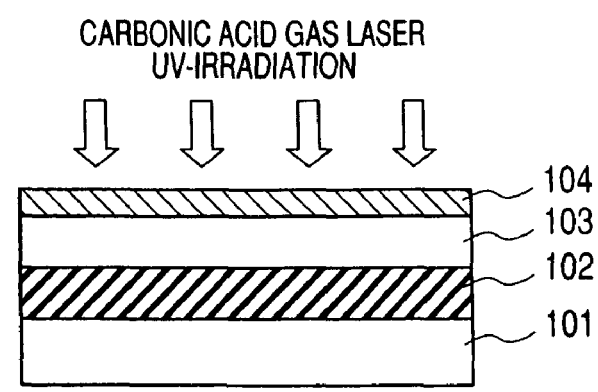

Embodiment 1 of the present invention is to be described specifically with reference to FIGS. 1A to 1C and FIG. 3. FIG. 1A to 1C show a cross sectional structure of a specimen used for the description of the embodiment 1 of the invention. The specimen is a substrate having the same structure as a substrate usually referred to as a thin film transistor substrate for an active matrix type display device. In this embodiment, examples of a method of irradiating only the carbonic acid gas laser to an amorphous Si film (method A) as shown in FIG. 1B and a method of irradiating a UV-light simultaneously with the carbonic acid gas laser as shown in FIG. 1C (method B) are referred to in comparison. Further, description is to be made also to examples of comparing the crystallization ratio and the surface unevenness of polycrystal Si films formed by crystallizing an amorphous Si film with a halogen lamp, an XeCl excimer laser and a carbonic acid gas laser.

The specimen in this example includes glass used for a substrate and an Si nitride film 102 of 100 nm thickness formed on the glass substrate 101, an Si oxide film 103 of 100 nm thickness formed thereon, and an amorphous Si film 104 of 60 nm thickness formed thereon. The Si nitride film 102 was formed by a plasma chemical vapor deposition method (hereinafter referred to as plasma CVD method) using monosilane ($SiH_4$), ammonia ($NH_3$), and nitrogen ($N_2$) as a starting gas, the Si oxide film was formed by a plasma CVD method using tetraethoxy silane (TEOS) and oxygen ($O_2$) as a starting gas, and amorphous Si film 104 was formed by a plasma CVD method using $SiH_4$ and argon (Ar) as a starting gas at a temperature of 350° C., respectively. Then, nitrogen annealing was conducted at 500° C. for 60 min to apply a dehydrogenating treatment to the amorphous Si film 104 (FIG. 1A).

In the method A, as shown in FIG. 1B, only the carbonic acid gas laser was irradiated at first to each of specimens. On the other hand, in the method B, a UV light was irradiated simultaneously with the carbonic acid gas laser to each of the specimens. The UV light was irradiated by using a spot UV irradiation device for a range of about 8 mm radius with the radiation region of the carbonic acid gas laser as a center. In this case, the laser was irradiated within a range from room temperature (with no heating) to 400° C. using a substrate temperature as a parameter both for the method A and the method B. The carbonic acid gas laser was irradiated in the continuous oscillation mode and the laser irradiation energy was 160 $J/cm^2$. The irradiation region of the carbonic acid gas laser was defined as 6 mm×2 mm and irradiation was conducted over the entire surface of a glass substrate by moving a moveable substrate stage. In this embodiment, the irradiation time was set to 600 micro-seconds and overlap of the irradiation regions was set to 10%. In this example, the irradiation region of the carbonic acid gas laser was set to 6 mm×2 mm but the area of the radiation region can be set optionally by adjusting an optical lens.

Figures 2, 3:
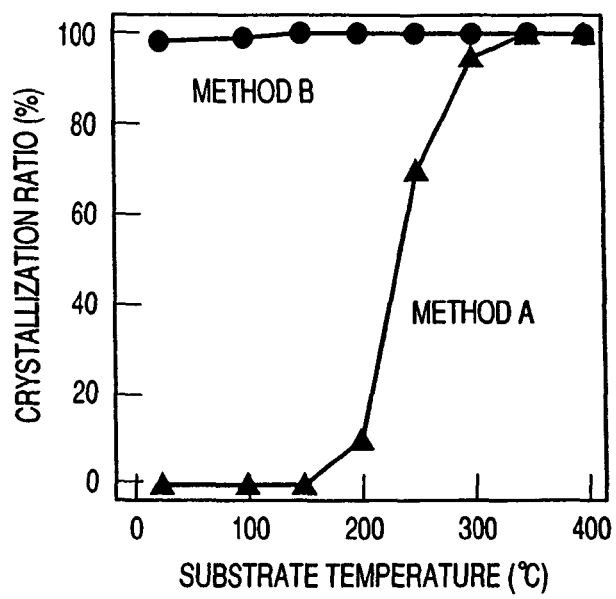
FIG. 2 is a view showing a crystallization ratio of an amorphous Si film for explaining embodiment 1 of the invention.
FIG. 3 is a view showing a crystallization ratio of an amorphous Si film for explaining embodiment 1 of the invention.
Figure 4:
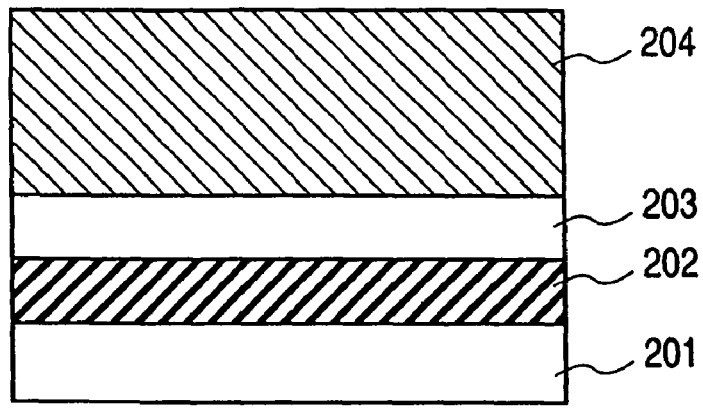
FIG. 4 is a cross sectional view of a specimen for explaining embodiment 2 of the invention.

FIG. 2 shows a relation between the substrate temperature and the crystallization ratio upon laser irradiation in the method A and method B respectively. The crystallization ratio was calculated by Raman spectroscopy. Specifically, it was calculated as an intensity ratio for integrated values of an absorption spectrum of optical phonons attributable to amorphous Si and absorption spectrum attributable to polycrystal Si.

As shown in FIG. 2, in the method A not conducting UV irradiation, crystallization occurred scarcely in a region where the substrate temperature was about 200° C. or lower. Crystallization proceeded from the vicinity of the substrate temperature at 250° C. and the crystallization ratio reached about 100% in a region of about 300° C. or higher. On the contrary, in the method B conducting the laser irradiation and UV irradiation simultaneously, crystallization ratio reached about 100% even without heating the substrate. This result shows that the density of the free carriers in the amorphous Si film 104 increased to about 1e18/$cm^3$ or higher even without increasing the substrate temperature by heating.

In this example, the UV light was used for the irradiation light, but the same result was obtained also by a visible light by increasing the free carrier density of the material irradiated by the carbonic acid gas laser to about 1e18/$cm^3$ or higher. Further, while the region for irradiating the light was defined as a range of about 8 mm radius with the irradiation region of the carbonic acid gas laser being as the center, the size of the light irradiation region can be set optionally so long as the free carrier density in the region irradiated by the carbonic acid gas laser is about 1e18/$cm^3$ or more.

Then, the specimen of the structure shown in FIG. 1A was used and the amorphous Si film 104 was crystallized by the method shown below and the crystallization ratio and the surface unevenness were compared with those of the polycrystal Si film. The crystallizing method for the amorphous Si film 104 includes three methods, i.e., (1) halogen lamp heating, (2) XeCl (Xenone chloride) laser heating, and (3) carbonic acid gas laser and UV-irradiation.

At first, details for the halogen lamp heating as the first method are to be described. Halogen lamp heating having a plurality of wavelengths of 1 μm or less has been used generally as a short time heating method for an Si substrate in the Si semiconductor process. Since the of UV light contains less component causing absorption in the Si oxide film or Si nitride film, the amorphous Si film 104 absorbs the light and is overheated in the structure shown in FIG. 1. In this embodiment, a heat treatment was conducted in a nitrogen atmosphere at 700° C. for 1 min while considering the heat resistance of the glass substrate. Then, in the XeCl laser heating as the second method, crystallization was conducted under the irradiation conditions at an irradiation energy of 400 mJ/$cm^2$ for an irradiation time of 30 nano-seconds. Finally, in the carbonic acid gas laser as the third method irradiation conditions were at an irradiation energy of 160 J/$cm^2$, for 600 micro-seconds of irradiation time, and UV irradiation was conducted simultaneously with the laser irradiation. In the laser anneal heating, substrate was not heated.

FIG. 3 shows the crystallization ratio, the surface unevenness, and the mobility of the polycrystal Si films crystallized by the three methods in comparison. For the surface unevenness, the maximum value was calculated based on the observation for the cross sectional structure of specimen by using a scanning type electron microscope (SEM) and a transmission type electron microscope (TEM). Further, the mobility of the polycrystal Si film was calculated according to 4-terminal hole measurement (van der Pauw method). As shown in FIG. 3, the crystallization ratio was about 75% and the amorphous Si component remained in the lamp heating method, whereas XeCl laser heating and carbonic acid gas laser heating showed the crystallization ratio of 90% or more.

Mobility by the 4-terminal hole measurement showed values of 1 $cm^2$/V·s or less in the lamp heating method, 50 $cm^2$/V·s to 140 $cm^2$/V·s for XeCl laser heating, and 10 $cm^2$/V·s to 30 $cm^2$/V·s for carbonic acid gas laser heating. The hole mobility is concerned not only with the crystallization ratio but also the crystallinity (defect density in the film) and a larger value is shown generally for the method of higher crystallization temperature. That is, while the XeCl laser and the carbonic acid gas laser showed an identical crystallization ratio, the greatest value is shown by the XeCl laser for crystallization by increasing the temperature as far as the melting temperature. However, in view of the variation thereof, it was greater in the XeCl laser heating. This result shows that the crystallinity is more uniform in the carbonic acid gas laser not increasing the temperature as far as the melting temperature and it provides an advantage that the variation of the threshold voltage in the polycrystal Si-TFT, etc. is decreased.

On the other hand, for the unevenness on the surface of the polycrystal Si film, while a large unevenness of 30 nm or more was present in the XeCl laser heating, the unevenness was 10 nm or less in the lamp heating method and the carbonic acid gas laser heating, and an extremely smooth surface was obtained. That is, the polycrystal Si film having a high crystallization ratio and a smooth surface was obtained only by the heating method of the invention.

While the glass substrate was used in this embodiment, identical investigation was conducted also by using a resin substrate or a resin film having a heat resistance of about 350° C. also as the substrate. However, since the heat resistance of the film is low in the case of the resin substrate or the resin film, film formation for the amorphous Si film was conducted by a reactive sputtering method with extremely less hydrogen content, and crystallization was conducted while saving a hydrogenation treating step. Identical effects with those of the glass substrate were obtained for the crystallization ratio, the mobility, and the surface unevenness of the crystallized polycrystal Si film. However, in the lamp heating method, crack and warp were generated in the resin substrate or resin film since the temperature was high.

As has been described above, favorable results were obtained in this embodiment for the crystallization ratio, the mobility, and the surface roughness of the polycrystal Si film also by using the resin substrate or the like with less heat resistance.

Embodiment 2

Then, description is to be made specifically to an embodiment 2 of the invention with reference to FIG. 4 to FIG. 7. This shows an example of conducting crystallization by irradiating a carbonic acid gas laser and a UV light to an Si nitride film 202, an Si oxide film 203, and an amorphous Si film 204 of different thickness formed above a glass substrate 201. For the comparison, excimer irradiation was investigated also on a specimen of an identical structure. In this embodiment, a specimen of a structure shown in FIG. 4 was used. The fundamental film constitution and the film forming process were identical with those in the methods described for the embodiment 1, and only the thickness of the amorphous Si film 204 was different.

In this embodiment, the thickness of the amorphous Si film 204 formed at the uppermost layer was set to 50 nm to 450 nm. The irradiation conditions for the carbonic acid gas laser were fixed at an irradiation energy of 160 J/cm$^2$ and for an irradiation time of 600 micro-seconds. For the excimer laser, a xenon chloride (XeCl) excimer laser at a wavelength of 308 nm was used and conditions were fixed at an irradiation energy of 400 mJ/cm$^2$ and for an irradiation time 30 nano-seconds. Substrate was not heated in all of the specimens.

Figure 5:
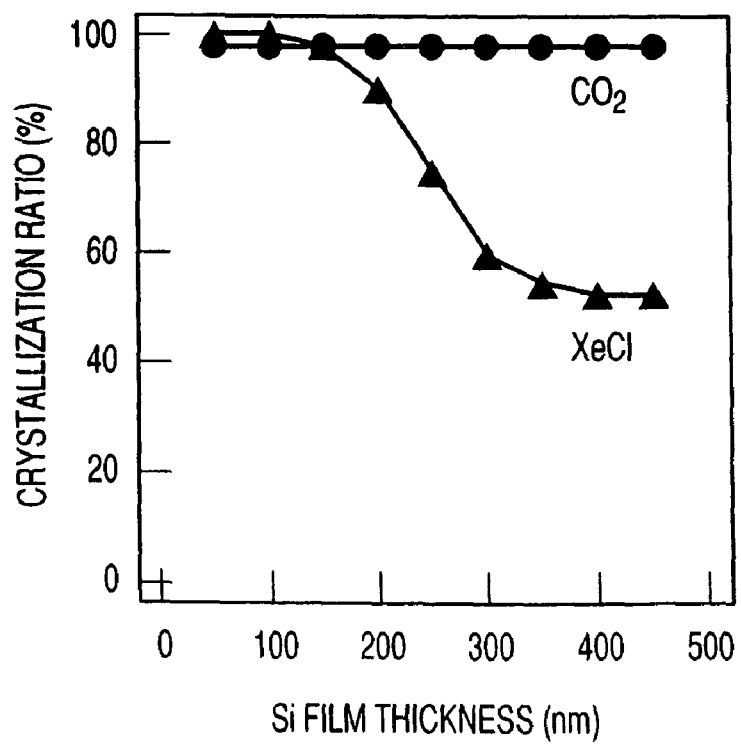
FIG. 5 is a view comparing crystallization ratio of an amorphous Si film for explaining embodiment 2 of the invention.

FIG. 5 shows a relation between the film thickness and the crystallization ratio of the formed amorphous Si film 204. The crystallization ratio of the Si film was calculated by Raman spectroscopy in the same manner as the embodiment 1. As shown in FIG. 5, in a case of crystallizing the amorphous Si film 204 by using the carbonic acid gas laser and the UV light, the crystallization ratio was substantially 100% for all of the range for the thickness of the amorphous Si film 204 of from 50 nm to 450 nm. On the contrary, in the excimer laser irradiation, the crystallization ratio started to be lowered when the thickness of the amorphous Si film 204 exceeded about 150 nm, and the crystallization ratio was saturated at about 50% for a film thickness exceeding about 350 nm.

Figure 6:
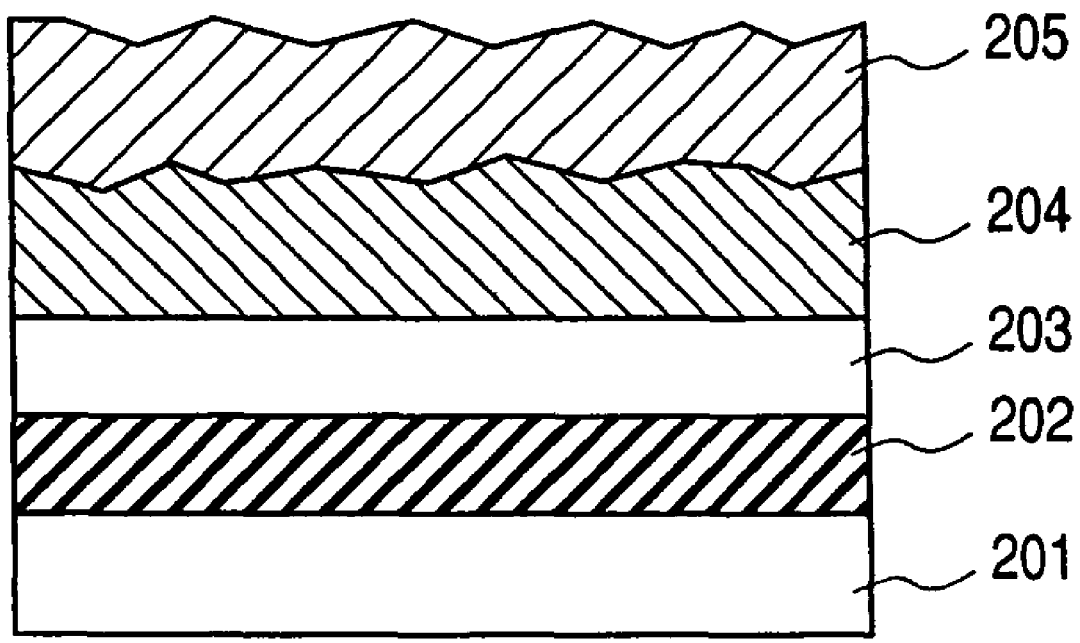
FIG. 6 is a schematic cross sectional view of an Si film crystallized by an existent method.

For examining the crystal state after the laser irradiation, a specimen formed with the amorphous Si film at 450 nm thickness was observed for the crystallinity along the cross section by using a transmission type electron microscope (TEM). FIG. 6 shows a schematic view for the cross sectional structure of a specimen irradiated by the excimer laser. In the excimer laser, it was found that crystallization occurred in a region from the surface to 200 to 250 nm thickness thereof to form a polycrystal Si layer 205, but the region therebelow was not crystallized and remained as an amorphous Si layer 204, or in a microcrystal state containing amorphous Si.

This is attributable to that most of the XeCl laser light at an extremely short wavelength (308 nm) is absorbed near the Si film surface (100 nm or less) and does not intrude to a deep region. That is, amorphous Si in a deeper region than the intruding depth of the excimer region is crystallized by heat conduction within the irradiation time. Accordingly, in a case of crystallizing the amorphous Si film by using the excimer laser, crystallization in the direction of the depth is restricted by the heat conduction rate while this depends on the irradiation energy and the irradiation time. Accordingly, in a case of the excimer laser, the Si film thickness of about 150 to 200 nm is a limit for crystallization within an actual range of condition.

On the contrary, since the carbonic acid gas laser is at a long wavelength (10.64 μm) and scarcely causes absorption to the Si film, the light intrudes to an extremely deep region. Further, since heating occurs when free carriers are present at a certain amount or more in the light intruding region, crystallization in the direction of the depth is determined by the mobility of the free carriers. In a case of irradiating the carbonic acid gas laser and the UV light simultaneously, the free carrier density reaches the maximum near the surface of the Si film where the UV light is absorbed. However, since the mobility of the free carriers in the semiconductor film is extremely large, the free carriers are diffused instantly even at a depth of several micrometer from the surface. With the phenomenon described above, in the specimen irradiated with the carbonic acid gas laser and the UV light simultaneously, the Si film is heated substantially uniformly in the direction of the depth.

As shown above, in a case of manufacturing the polycrystal Si-TFT by using the carbonic acid gas laser, it may be considered that the amorphous Si film to be crystallized is free from restriction for the thickness in an actual range of the film thickness. Further, while description has been made on crystallization of the amorphous Si film not doped with an impurity in this embodiment, the same effect is obtained also in a case of containing an impurity such as boron, phosphorus, or arsenic. An example of utilizing the feature is to be described with reference to FIG. 7. In this case, a photodiode of a P-i-N structure comprising a thick polycrystal Si film was manufactured.

Figure 7A:
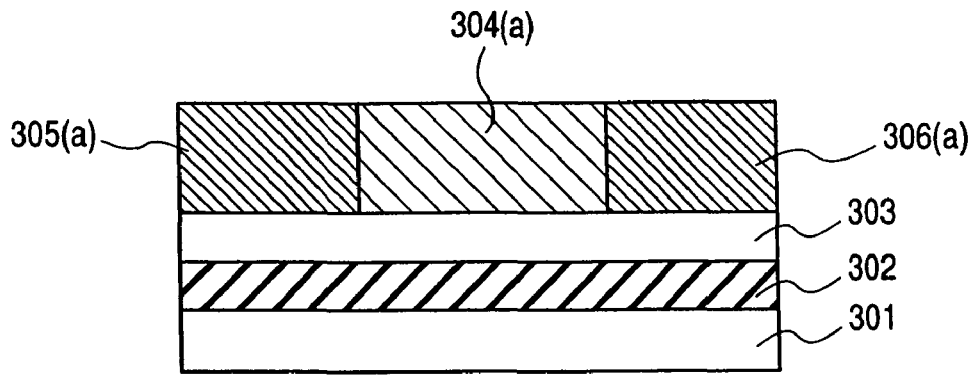
FIG. 7A, FIG. 7B, and FIG. 7C are cross sectional views of a P-i-N diode for explaining embodiment 2 of the invention.

At first, after continuously forming, an Si nitride film 302 of 100 nm thickness, an Si oxide film 303 of 100 nm thickness, and an amorphous Si film 304(a) of 500 nm thickness above a glass substrate 301, nitrogen annealing at 500° C. for 60 min was applied to conduct a dehydrogenating treatment to the amorphous Si film 304(a). Then, boron and phosphorus were formed by selectively implanting them to predetermined regions by photolithography and ion implantation. Boron was implanted to the region 305(a) in FIG. 7 at an energy of 35 KeV, 80 KeV, and 130 KeV by 3e14/cm$^2$ respectively. In the same manner, phosphorus was ion implanted in a region 306(a) in FIG. 7 at an energy of 100 KeV, 240 KeV, 380 KeV by 3e14/cm$^2$ respectively (FIG. 7A).

Figure 7B:
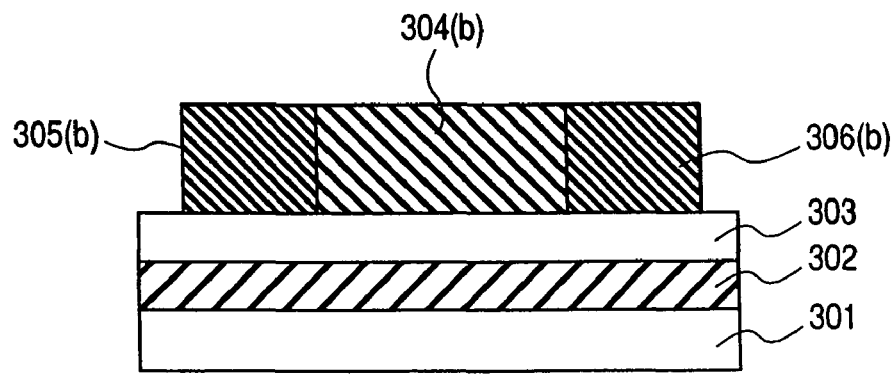
Figure 7C:
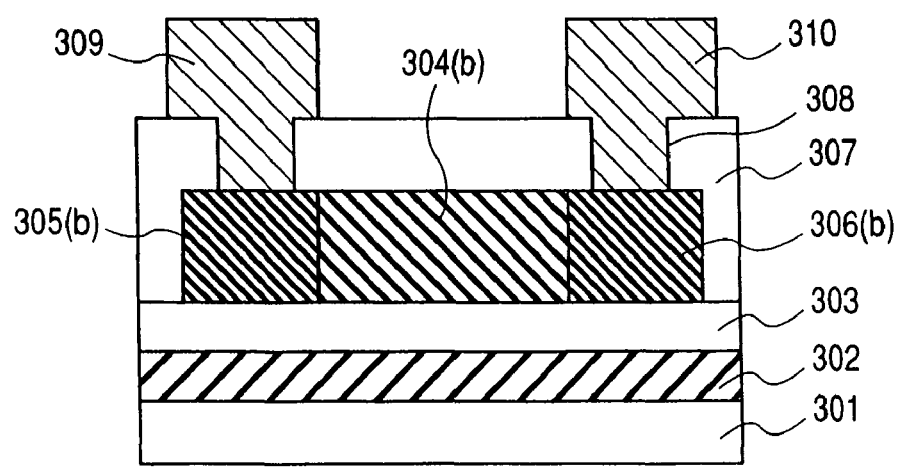

Then, carbonic acid gas laser and UV irradiation were conducted under the conditions described in the embodiment 1 to crystallize the amorphous Si films 304(a), 305(a), and 306(a). This transformed the amorphous Si film into a P-type polycrystal Si film 305(b), an N-type polycrystal Si film 306(b), and a non-doped polycrystal Si film 304(b). Successively, the polycrystal Si films 304(b), 305(b), and 306(b) were fabricated each into a predetermined shape by using lithography and dry etching to manufacture a polycrystal Si of a P-i-N structure (FIG. 7B).

Then, after forming an Si oxide film 307 of 800 nm thickness, openings 308 were formed to expose the surfaces of the P-type region 305(b) and the N-type region 306(b) of the polycrystal Si. Successively, metal interconnections 309 and 310 formed of titanium (Ti), titanium nitride (TiN), and aluminum (Al) were formed to manufacture a polycrystal Si diode of a P-i-N structure.

A light was irradiated in a state of applying a reverse bias to the P-i-N junction, and a current through the diode was measured. When compared with a P-i-N diode comprising a polycrystal Si film crystallized by solid phase growing at high temperature (1000° C.), a substantially identical characteristics were obtained.

According to this example, as described above, a diode showing good characteristics can be manufactured also on a glass substrate having a heat resistance of 500° C. That is, according to this embodiment, a thick P-i-N diode can be formed simultaneously with the polycrystal Si-TFT on the glass substrate to enhance the addition value of a device using the polycrystal Si-TFT. Further, the effect of this embodiment was obtained not only for the glass substrate but also on the resin substrate or resin film in the same manner.

While the P-i-N diode was manufactured as a planar structure in this embodiment, it is of course possible to manufacture the diode in the direction perpendicular to the substrate.

Embodiment 3

Figure 8:
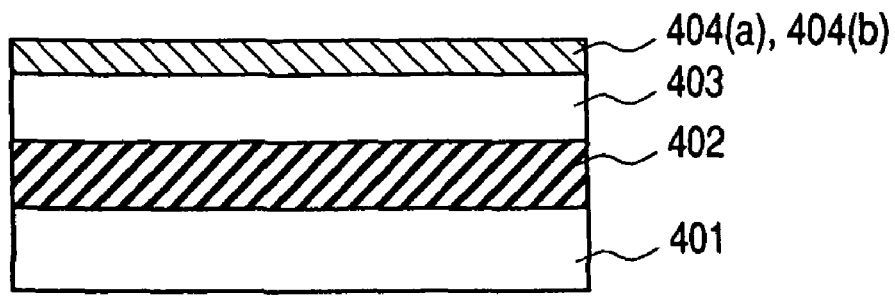
FIG. 8 is a cross sectional view of a specimen for explaining embodiment 3 of the invention.

Then, description is to be made specifically to an embodiment 3 of the invention. This shows an example of investigation on the roughness at the surface of an Si film and an SiGe film when the irradiation energy of the carbonic acid gas laser is changed. A structure of a specimen used in this embodiment is shown in FIG. 8. The fundamental film constitution and process are identical with those shown in the embodiment 1 and comparison was made in this case between a case of using an amorphous Si film 404(a) and an amorphous SiGe film 404(b) for the uppermost layer. The amorphous Si film 404(b) was formed by a plasma CVD method using $SiH_4$, monogermane ($GeH_4$), and argon (Ar) as the starting gas at a temperature of 400° C. In the amorphous SiGe film 404(b), the Ge concentration was set to 20% by controlling a gas flow rate between $SiH_4$ and $GeH_4$. The film thickness of the amorphous Si film 404(a) and the amorphous SiGe film 404(b) was set to 60 nm.

Since the temperature of the Si film varies by the heat conductivity and the thickness of the underlayer for the amorphous Si film, it is expressed not as the irradiation energy of the carbonic acid gas laser in this example but as the saturation temperature of the Si film. The heat treatment temperature upon irradiation of laser shown below is a saturation temperature when measured for the Si film by a radiation thermometer. Also in this embodiment, the substrate was not overheated and UV irradiation was conducted simultaneously with the laser irradiation. The surface roughness of the crystallized Si film was measured by an atomic force microscope (AFM). The scanning range for AFM measurement was set to 1 μm×1 μm and the average unevenness for the regions was compared.

Figure 9:
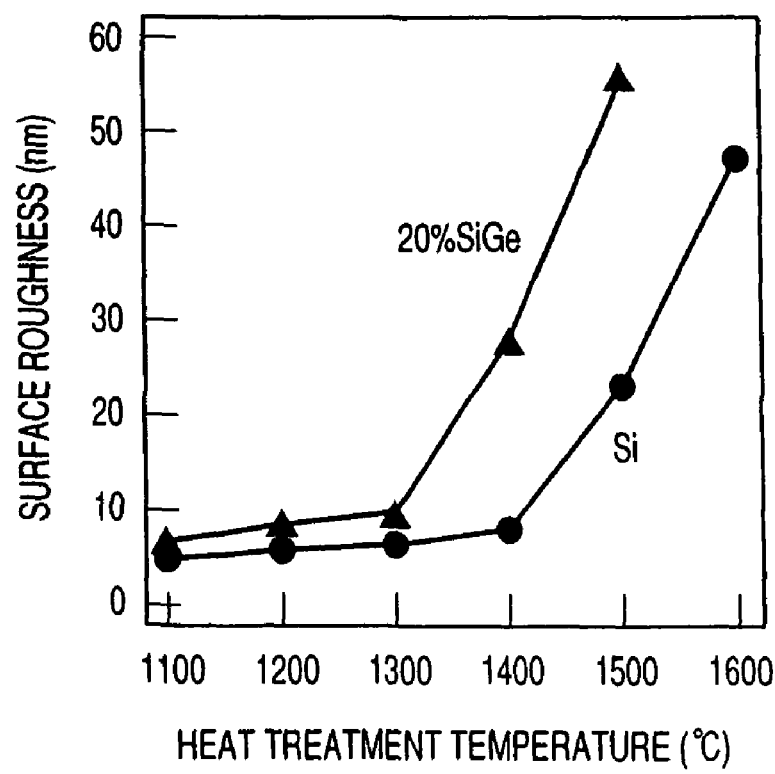
FIG. 9 shows dependence of surface roughness on a heat treatment temperature for explaining embodiment 3 of the invention.

FIG. 9 shows relation between the heat treatment temperature and the surface roughness. The surface unevenness increased about at 1350° C. or higher for the specimen formed by heat treating an SiGe film and at about 1450° C. or higher for the specimen formed by heat treating an Si film. In this embodiment, since the heat treatment was applied at a 50° C. interval, a turning point where the surface unevenness increases is present in a strict meaning within range from 1300° C. to 1350° C. for the SiGe film and within a range from 1400° C. to 1450° C. for the Si film. The turning point is concerned with the melting point of the material to be overheated. Generally, in the excimer laser represented by an XeCl laser, when annealing is conducted under the condition of making the crystallinity uniform in the direction of the depth of the material to be overheated, the surface of the Si film exceeds the melting point and transforms to a liquid phase state. Accordingly, the surface unevenness increases in the solidifying process.

Also in the carbonic acid gas laser, unevenness of the film surface increases when annealing is conducted at a temperature exceeding the melting point but, when heat treatment is applied at a temperature not exceeding the melting point, a polycrystal SiGe film or a polycrystal Si film having a uniform crystallinity in the direction of the depth can be obtained.

While description has been made in this embodiment to an example of an SiGe film having 20% Ge concentration, since the melting point of the SiGe film is different depending on the Ge concentration, it is important to conduct crystallization at a temperature not exceeding the melting point thereof. Further, this invention is not restricted to the SiGe film or the Si film and, in a case of crystallizing the material to be heated or activating the impurity by the carbonic acid gas laser, it is important to conduct heating within a range not exceeding the melting point if it is intended to obtain a planarity on the film surface.

As a result of measuring the hole mobility of the polycrystal SiGe film crystallized by the carbonic acid gas laser according to the invention, a mobility of from 10 $cm^2/V \cdot s$ to 30 $cm^2/V \cdot s$ was obtained in the same manner as in the polycrystal Si film although different somewhat depending on the Ge concentration.

Embodiment 4

Figure 11A:
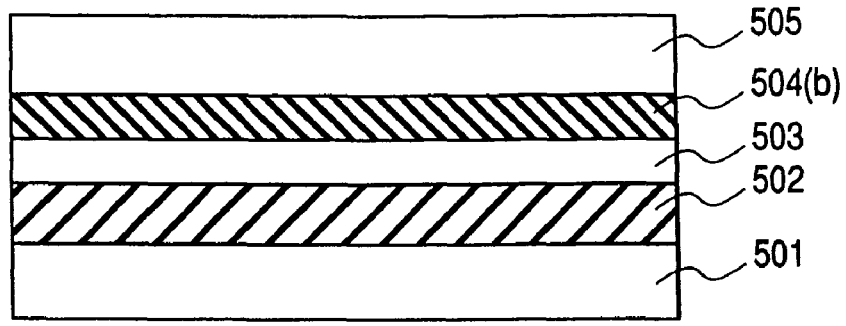
FIG. 11A, FIG. 11B, and FIG. 11C are cross sectional views of a specimen for explaining embodiment 4 of the invention.

Then, an embodiment 4 of the invention is to be described in details. In this case, the activation method for the impurity-implanted Si film and the result of investigation on the uniformity of the sheet resistance are to be described. The structure of the specimen manufactured in this embodiment and a measuring method for the sheet resistance are to be described with reference to FIG. 10 and FIG. 11. In this case, a quartz substrate 501 of high heat resistance was used for simplifying the process. At first, after forming an Si nitride film 502 of 100 nm thickness on a quartz substrate 501 of a nominal 8 inch size by a low pressure chemical vapor deposition method (hereinafter simply referred to as LP-CVD method), three types of Si oxide films 503 each of different film thickness were formed. In this embodiment, the thickness of the Si oxide films 503 was set to 80 nm, 100 nm, and 120 nm (FIG. 10). The Si nitride film 502 was formed by using dichlorosilane ($SiH_2Cl_2$) and $NH_3$ as the starting gas at a temperature of 780° C., and an Si oxide film 503 was formed by using $SiH_4$ and nitrogen suboxide ($N_2O$) at a temperature of 750° C.

Then, a polycrystal Si film 504(b) of 60 nm thickness was formed by the LP-CVD method using $SiH_4$ as the starting gas at a temperature of 610° C. Successively, Si oxide films 505 each of different film thickness were formed above the polycrystal Si film 504(b). In this embodiment, the thickness of the Si oxide film 505 includes three types of 120 nm, 100 nm, and 80 nm (FIG. 10). Since the thickness of the Si oxide film 503 below the polycrystal Si film 504(b) includes three types and the thickness of the Si oxide film 505 above the film 504(b) includes three types, the thickness of the upper and lower Si oxide films sandwiching the polycrystal Si film 504(b) includes 9 types in all (FIG. 10).

Figure 11B:
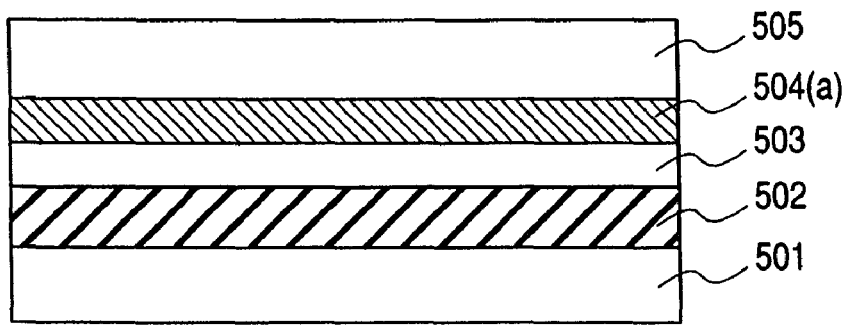

Then, as shown in FIG. 11B, phosphorus (P) was ion implanted near the boundary between the polycrystal Si film 504(b) and the Si oxide film 505 formed thereon by using an ion implantation method. The injection amount (dose) of phosphorus was made uniform at $2e15/cm^2$. The implantation energy was changed corresponding to the thickness of the Si oxide film 505 at the uppermost layer. For example, the implantation energy of phosphorus was set to 110 keV for the specimen in which the thickness of the Si oxide film 505 at the uppermost layer was 100 nm. In this case, the implantation depth where the phosphorus concentration reached maximum was about 110 nm from the uppermost surface and most of the polycrystal Si film 504(b) was transformed to an amorphous Si film 504(a) considering the implantation distribution of phosphorus. Referring strictly, a region for about 40 nm from the boundary of the polycrystal Si film 504/Si oxide film 505 was transformed to amorphous Si and a region for about 20 nm therebelow has a structure approximate to mixed crystals of amorphous Si and polycrystal Si.

Then, the amorphous Si film 504(a) was crystallized (activated) by the three types of methods shown in the embodiment 1. The first method is halogen lamp heating, the second method is XeCl laser heating, and the third method is carbonic acid gas laser ($CO_2$) heating.

At first, in the halogen lamp heating as the first method, a heat treatment was conducted in a nitrogen atmosphere at 700° C. for 1 min considering the limit for the heat resistance of the glass substrate. Then, the irradiation conditions for the XeCl laser as the second method were made identical with the conditions described in the embodiment 1. Substrate heating was not conducted and crystallization was conducted at an irradiation energy of $400\,mJ/cm^2$ for an irradiation time of 30 nano-seconds. Finally, also the irradiation conditions for the carbonic acid gas laser as the third method were made identical with the conditions shown in embodiment 1. The substrate heating was not conducted and UV irradiation was conducted simultaneously with the laser irradiation. Crystallization was conducted at an irradiation energy of the carbonic acid gas laser of $160\,mJ/cm^2$ for an irradiation time of 600 micro-seconds. The temperature of the Si film at the energy was about 1200° C.

Figure 11C:
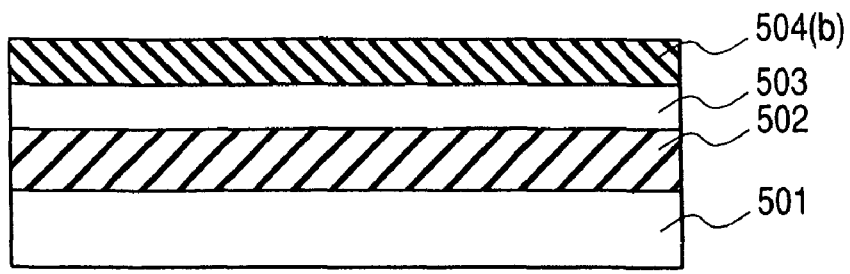

Then, the Si oxide film 505 at the uppermost layer was removed by using an aqueous solution of diluted hydrofluoric acid to expose the surface of the crystallized polycrystal Si film 504 (FIG. 11C). Then, the sheet resistance at 112 points within a wafer surface was measured and average value and variation thereof were examined. The variation of the sheet resistance is shown as a value obtained by dividing the difference between the maximum resistance value and the minimum resistance value by an average resistance value. FIG. 12 shows the result. The average value (112 points) for the sheet resistance in the wafer surface was the largest in the case of the lamp heating method and decreased in the order of the XeCl laser heating method and the carbonic acid gas laser. The variation of the sheet resistance in the wafer surface (three types) and the variation between the wafers (9 types) were largest in the case of the XeCl laser method and decreased in the order of the lamp heating method and the carbonic acid gas laser heating method.

The average value for the sheet resistance was determined by the heating temperature for the Si film 504. While the activation ratio was small on the lamp heating since the temperature was 700° C., 95% or higher activation ratio was shown in the laser heating since the temperature was extremely high to lower the resistance. This shows that laser annealing is effective for activation after ion implantation to the source and the drain only in view of the resistance value.

On the other hand, multiple reflection of a light is greatly concerned with the variation within the surface and variation between the wafers of the sheet resistance. Particularly, in the laser annealing method where the heat treating time is extremely short, since there is scarce lateral component of the heat conduction, variation of the light intensity is directly reflected on the variation of the resistance value. Description is to be made specifically on the cause of the variation for the sheet resistance in the lamp heating and the XeCl laser heating.

When a light is irradiated to a laminate film having a plurality of boundaries, light reflection occurs reflecting the difference of refractive index and absorption index at each of the boundaries. Referring to the embodiment shown in FIG. 11A as an example, boundaries are present at five positions including the uppermost surface, and reflection occurs at each boundary. The light intensity in the amorphous Si film 504(b) undergoes the effect of reflection from the boundaries present above and below the amorphous Si film 504(b). Accordingly, when the thickness of the dielectric films present above and below the amorphous Si film 504(b) is different, the light intensity also differs greatly. The multiple reflection of the light is determined depending on the thickness of each layer and the light wavelength, and the reflective index fluctuates greatly as the wavelength of the light is shorter even with slight difference of the film thickness. Referring strictly, since the amorphous Si film 504(b) is transformed into the polycrystal 504 Si film (a) in the course of the heat treatment, the refractive index and the absorption index also change in the course of the heat treatment.

Most of the film thickness of each dielectric films and semiconductor films is within a range from 50 nm to 1000 nm in the polycrystal Si-TFT process, and this is a film thickness identical with that of the wavelength for the halogen lamp (plural wavelengths 1000 nm or less) or the wavelength of the excimer layer (of 500 nm or less). Accordingly, the effect not only of the fluctuation of the film thickness due to the process for the amorphous Si film 504(b) (variation of film thickness) but also the fluctuation of the film thickness of upper and lower dielectric films (variation of thickness) increases greatly. In the halogen lamp heating, although the effect of the multiple reflection is present, variation of the resistance value is suppressed relatively due to the effect of the heat conduction since the irradiation time is long. However, in the XeCl laser irradiation, since the irradiation time is short and there is no effect of heat conduction, even a slight fluctuation of the thickness in each of the layers varies the multiple reflection and, finally, varies the resistance value.

On the other hand, the wavelength of the carbonic acid gas laser is 10.64 μm, which is longer by one digit or more compared with the thickness for each layer. Accordingly, change of the multiple reflection is extremely small even when the thickness of each layer fluctuates slightly. Therefore, variation of the sheet resistance is suppressed greatly even when the thickness of each layer changes. While this embodiment shows an example in which the range for the thickness of the Si oxide film 503 below the amorphous Si film 504(b) and the Si oxide film 505 above the Si oxide film 503 was defined to 80 nm to 120 nm, substantially identical valuation was obtained even when specimens of greatly different film thickness were evaluated.

As shown above, considering the variation of the activation ratio of the impurity implanted into the semiconductor, it is possible to suppress the effect of the multiple reflection of a light and decrease the variation of the activation ratio by applying this invention.

Embodiment 5

Then, detailed descriptions are to be made for embodiment 5 of the invention. In this case, the effectiveness of this embodiment is to be described with reference to the breakdown field effect strength of the gate insulator and the sheet resistance in a case of changing the crystallizing method for the polycrystal Si-TFT channel layer and the activation method for the source and drain region.

Figure 17A:
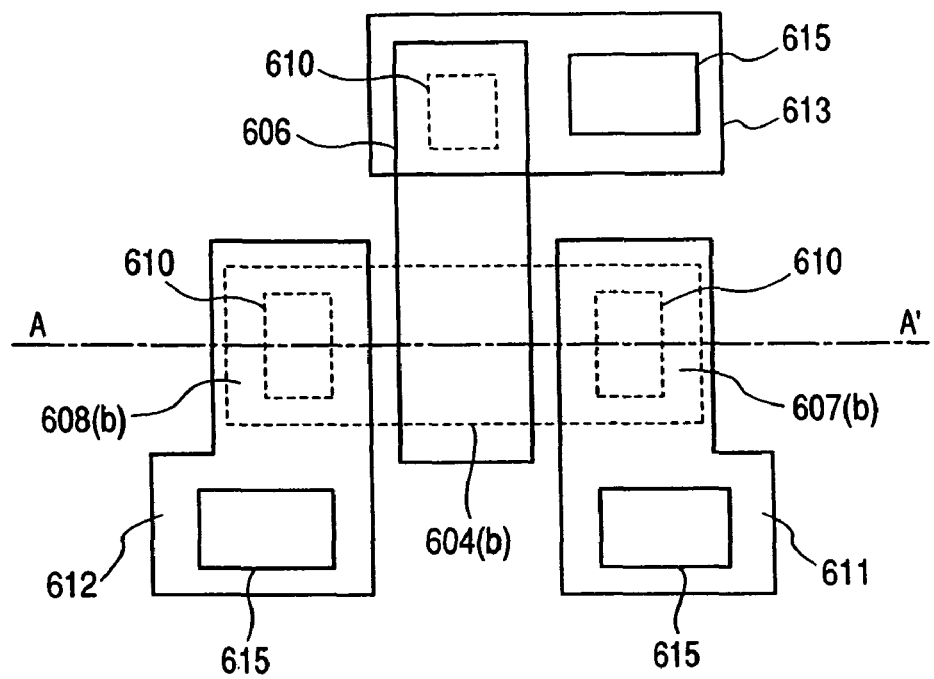
FIG. 17A and FIG. 17B are a plan view and a cross sectional view of a specimen for explaining embodiment 5 of the invention, respectively.
Figure 17B:
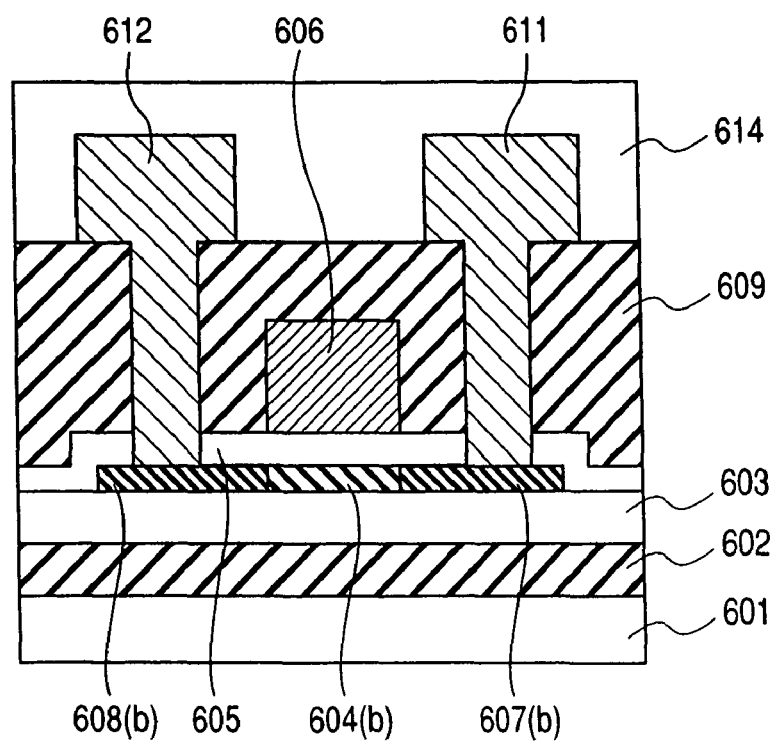

FIG. 13 describes the method of crystallizing the channel layer for each specimen and the method of activating the diffusion layer (source, drain). FIG. 17A is a plan view for a polycrystal Si-TFT manufactured in this embodiment and FIG. 17B is a cross sectional view along region A-A' shown in the plan view. An Si nitride film 602 and an Si oxide film 603 were formed above a glass substrate 601, above which a polycrystal Si-TFT comprising a gate electrode 606, a gate electrode interconnection 613, a gate insulator 605, a source 607(b), a source interconnection 611, a drain 608(b), a drain interconnection 612, and a channel 604(b) was manufactured. In this embodiment, the channel length L was set to 3 μm and the channel width W was set to 4 μm for the polycrystal Si-TFT in this embodiment. The manufacturing method thereof is to be described specifically with reference to the drawings.

Figure 14A:
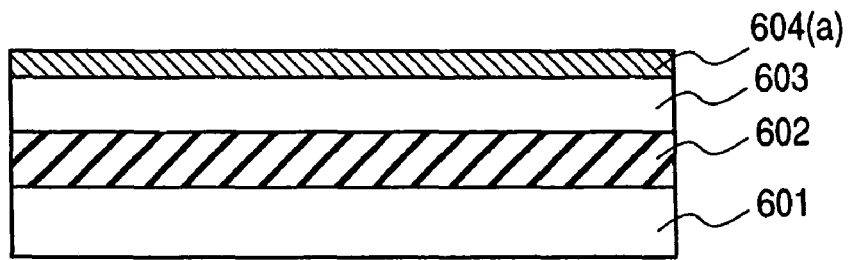
FIG. 14A, FIG. 14B, and FIG. 14C are cross sectional views of a specimen for explaining embodiment 5 of the invention.
Figure 14B:
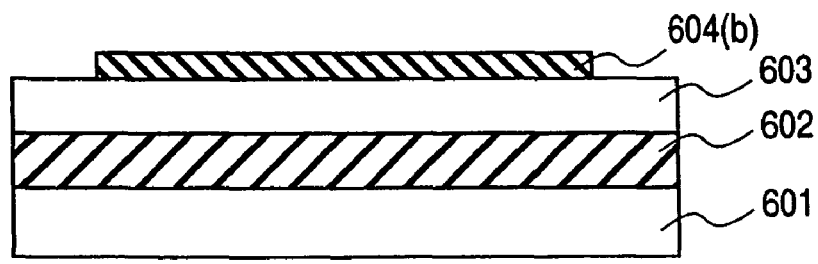

At first, after forming on the glass substrate 601, the Si nitride film 602 (100 nm), the Si oxide film 603 (100 nm), and an amorphous Si film 604(a) (600 nm) successively by the method identical with that explained in embodiment 1, nitrogen annealing was conducted at 500° C. for 60 min to conduct a dehydrogenating treatment for the amorphous Si film 604(a) (FIG. 14A). Then, as shown in FIG. 13, the amorphous Si film was crystallized to the crystal Si film 604(b) by using an XeCl laser for the specimen #1 and by using a carbonic acid gas laser for specimens #2 and #3. The laser irradiation conditions in this embodiment were made identical with those for embodiment 1. Substrate overheating was not conducted and UV irradiation was conducted simultaneously with the carbonic acid gas laser irradiation. Successively, the polycrystal Si film 604(b) was fabricated to a predetermined shape to form an active layer by lithographic and dry etching methods (FIG. 14B).

Figure 14C:
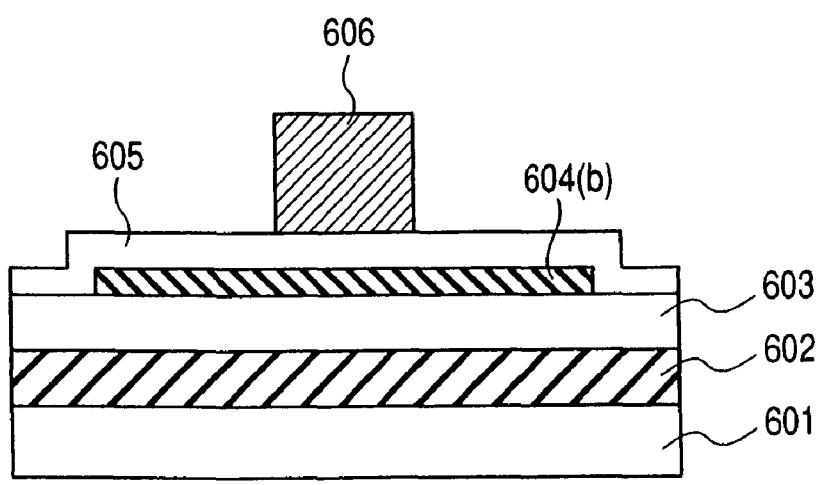

Then, after forming the Si oxide film 605 as the gate insulator 605, boron was implanted by an ion implantation method to the polycrystal Si film 604(b) as the channel layer for controlling the threshold voltage. In this case, after forming the tungsten film 606 as the threshold voltage gate electrode 606, the tungsten film 606 was fabricated into a predetermined shape (FIG. 14C). The gate insulator 605 was formed by a plasma CVD method using $SiH_4$ and $N_2O$ as the starting gas, and the gate electrode 606 was formed by a reactive sputtering method using an Ar gas. In this embodiment, the thickness of the gate insulator 605 was made to 50 nm and the thickness of the gate electrode 606 was set to 150 nm.

Figure 15A:
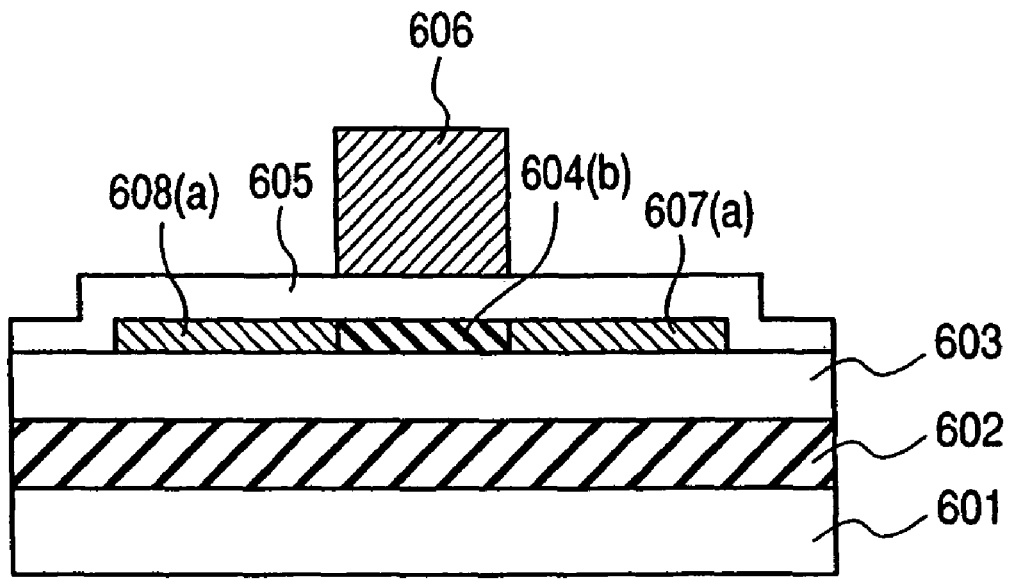
FIG. 15A and FIG. 15B are cross sectional views of a specimen for explaining embodiment 5 of the invention.

Then, phosphorus (P) was implanted by an ion implantation method to a region as the source 607(a) and the drain 607(b) In this case, the dose energy was set to 60 keV and the dose amount was set to $2e15/cm^2$ for phosphorus. In the phosphorus ion implantation described above, since phosphorus is not implanted to the Si film just below the gate electrode 606, it remains as the polycrystal Si film 604(b), whereas the Si film in the region not covered with the gate electrode 606 is transformed into amorphous Si films 607(a) and 608(b) (FIG. 15A). Then, for recovering the damages to the gate insulator 605 at the end of the gate electrode 606, nitrogen annealing was conducted at 500° C. for 30 min.

Figure 15B:
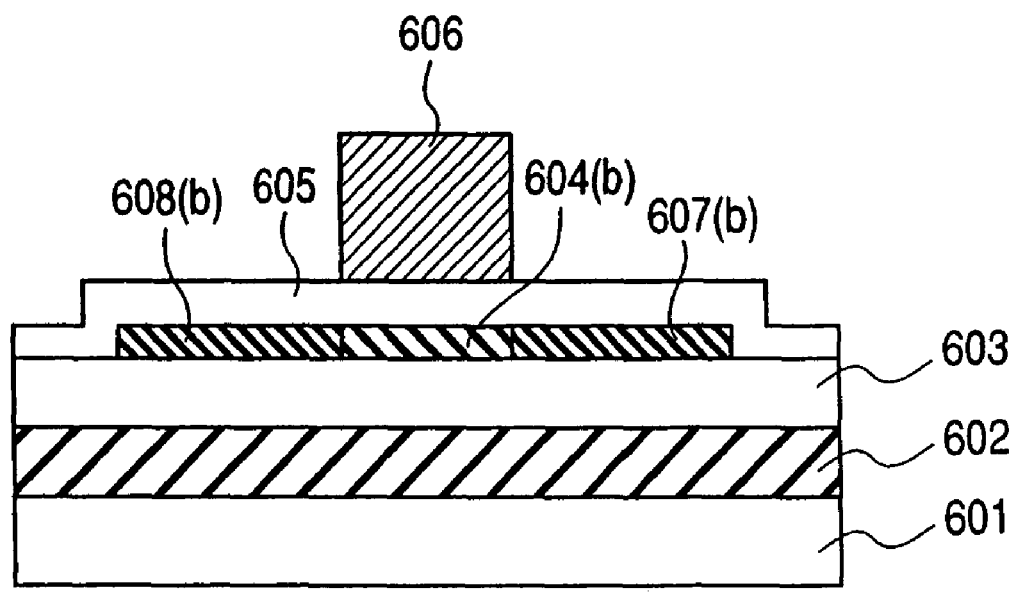

Successively, by using each of the activation methods shown in FIG. 13, an activating heat treatment was conducted for the region of the source 607 and the drain 608. A heat treatment was conducted as lamp heating for the specimens #1 and #2 by using a halogen lamp at 700° C. for 1 min. The specimen #3 was applied with a heat treatment under the same conditions as those in embodiment 3 by the carbonic acid gas laser. By the activating heat treatment, the source 607(b) and the drain 608(b) are transformed into a polycrystal Si film (FIG. 15B).

Figure 16A:
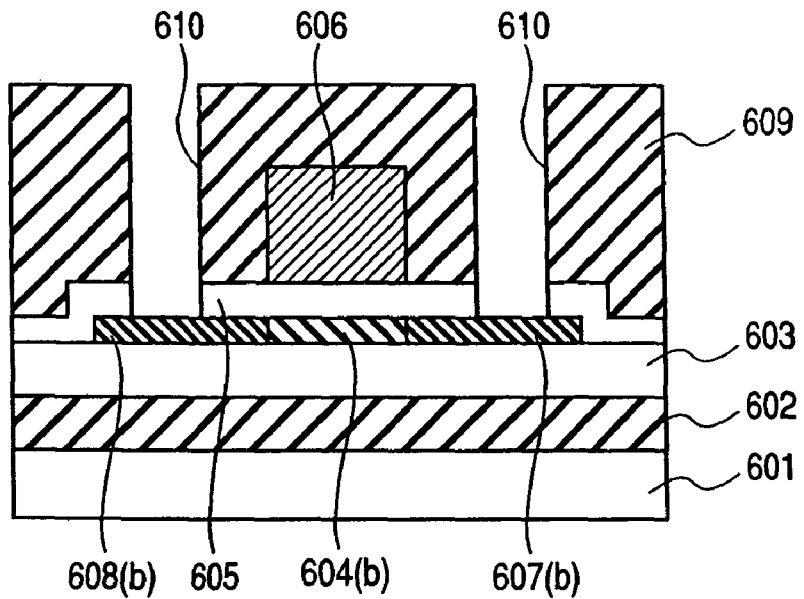
FIG. 16A and FIG. 16B are cross sectional views of a specimen for explaining embodiment 5 of the invention.

Then, after forming an Si oxide film 609 of about 600 nm thickness by using TEOS and $O_2$ as the starting gas by a plasma CVD method, openings 610 to expose the surfaces of the gate electrode 606, the source region 607(b), and the drain region 608(b) were formed (FIG. 16A). Since FIG. 16A shows a cross sectional area along A-A' shown in FIG. 17A, openings to expose the surface of the electrode 606 is not shown.

Figure 16B:
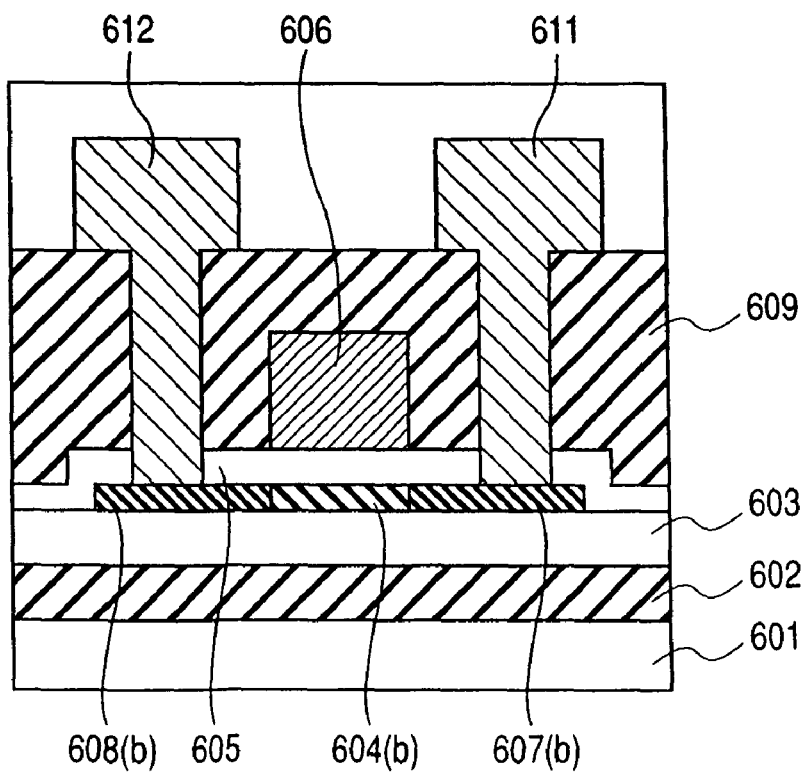

Successively, after continuously forming a laminate film comprising titanium (Ti), titanium nitride (TiN), and aluminum (Al) by using a reactive sputtering method, they were fabricated each into a predetermined shape to form a source interconnection 611, a drain interconnection 612, and a gate interconnection 613. In this case, the thicknesses of Ti, TiN, and Al were set to 10 nm, 20 nm, and 500 nm, respectively. Then, an Si nitride film 614 of 200 nm thickness was formed by using $SiH_4$, $NH_3$, and $N_2$ as the starting gas by a plasma CVD method and openings 610 to expose the surface of the aluminum interconnection were formed (FIG. 16B, FIGS. 17A and 17B).

Finally, a heat treatment was conducted in a hydrogen atmosphere at 400° C. for 30 min to complete the manufacture of the polycrystal Si TFT according to the embodiment of the invention. The size for the device and the absolute value for the thickness of the thin film shown in this embodiment are examples and the present invention is not restricted to such values.

In this embodiment, evaluation was conducted taking notice on the sheet resistance and the breakdown withstand voltage of the gate insulator of the manufactured polycrystal Si-TFT. In this embodiment, devices were measured by the number of 500 and variation for the sheet resistance and the dielectric breakdown withstand voltage were also evaluated. FIG. 18 shows the sheet resistance, the average value for the dielectric breakdown withstand voltage, and the variation thereof for each of the specimens are shown in comparison. For the sheet resistance and the variation thereof, the specimen #3 for which activating annealing for the diffusion layer was conducted by the carbonic acid gas laser showed most preferred values.

The result shows that the activation ratio of the diffusion layer is higher in the carbonic acid gas laser heating than in the halogen lamp overheating. On the other hand, for the dielectric breakdown withstand voltage of the gate insulator and the average value thereof, the specimen #2 and the specimen #3 showed favorable result that the dielectric breakdown withstand voltage was higher and variation thereof was smaller. Further, devices showing the dielectric breakdown withstand voltage of 2 MV/cm or lower, that is, the devices causing the dielectric breakdown already in the manufacturing process were formed at a ratio of about 5% in specimen

1, but the ratio was about 0.6% in the specimens #2 and #3. This result reflects that the surface of the polycrystal Si film crystallized by the carbonic acid gas laser is smooth compared with the surface of the polycrystal Si film crystallized by the excimer laser and local concentration of the electric field to the gate insulator is extremely small.

As shown in embodiment 1, while the mobility in the crystallization by the carbonic acid gas laser was smaller compared with the mobility in the crystallization by the XeCl laser, the variation thereof was decreased extremely. Reflecting the result, also for the variation of the threshold voltage of the polycrystal Si-TFT manufactured in this embodiment, crystallization by the carbonic acid gas laser showed most preferred uniformness.

While this embodiment shows an example of a polycrystal Si-FET by applying the polycrystal Si film to the channel layer, it is of course possible to use a polycrystal SiGe film for the channel layer. Further, while an example of NMOS is shown, the same effect was obtained also for PMOS. Further, while this embodiment shows an example of a top gate electrode type polycrystal Si-TFT in which the gate electrode situates above the channel region, also the bottom gate electrode type polycrystal Si-TFT in which the gate electrode situates below the channel region can provide an advantage capable of decreasing the sheet resistance value of the diffusion layer and the variation thereof.

Embodiment 6

Then, detailed descriptions are to be made to embodiment 6 of the invention. In this case, an example for the method of manufacturing a polycrystal Si-TFT utilizing the lateral wall portion of the patterned dielectric film according to the invention is shown.

FIG. 21 shows a plan view of a polycrystal Si-TFT manufactured in this embodiment (FIG. 22A) and a cross sectional view along region A-A' shown in the plan view (FIG. 22B) thereof. A polycrystal Si-TFT including a gate electrode 709, a gate electrode interconnection 716, a gate insulator 708, a source 706($b$), a source interconnection 712, a drain 707($b$), a drain interconnection 713, and a channel 704($b$) was manufactured above a glass substrate 701. In this embodiment, the polycrystal Si-TFT was configurated to a channel length L of 0.6 μm and a channel width W of 4 μm. The manufacturing method is to be described specifically with reference to the drawing.

Figure 19A:
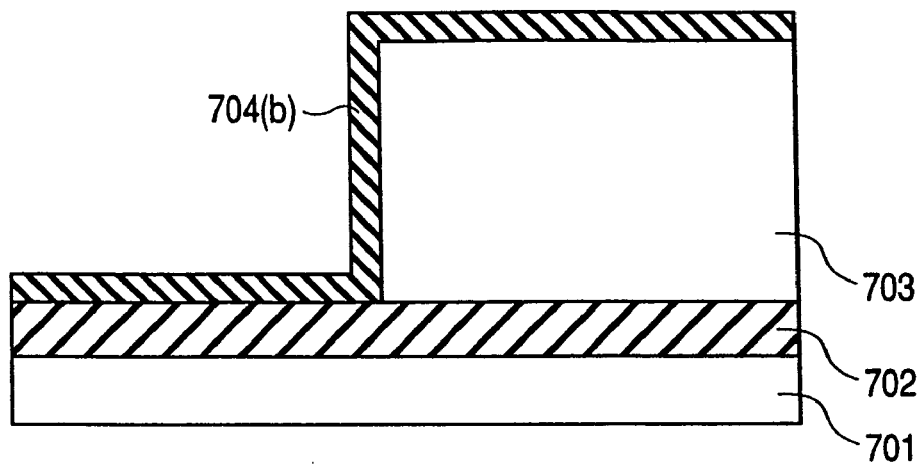
FIG. 19A and FIG. 19B are cross sectional views of a specimen for explaining embodiment 6 of the invention.

At first, after forming, on the glass substrate 701, an Si nitride film 702 of 100 nm and an Si oxide film 703 of 500 nm successively, the Si oxide film 703 was fabricated into a predetermined shape by lithographic and dry etching methods. Successively, after forming an amorphous Si film of 60 nm, nitrogen annealing at 50° C. for 60 min was conducted and a dehydrogenating treatment was conducted for the amorphous Si film. Then, the amorphous Si film was crystallized by carbonic acid gas laser and UV irradiation and transformed into a polycrystal Si film 704($b$). As shown in FIG. 19A, the polycrystal Si film 704($b$) is formed to the surface of the Si nitride film 702 as the underlayer, and the lateral wall of the Si oxide film 703 of 500 nm thickness having a vertical step and the surface thereof.

As described in embodiment 2, since the excimer laser causes absorption near the surface of the amorphous Si film, it is extremely difficult to crystallize the amorphous Si film situating in a deep region from the surface. That is, it is extremely difficult to crystallize the amorphous Si film formed on the lateral wall of the Si oxide film 703 as shown in FIG. 19A. However, in the carbonic acid gas laser, since the laser light transmits as far as sufficiently deep region of the amorphous Si film, crystallization is possible also on the lateral wall of the Si oxide film 703.

In this embodiment, the angle (taper) for the step of the Si oxide film 703 is important. Since fabrication for the gate electrode to be formed subsequently becomes difficult depending on the angle of the side wall of the underlayer, it is important to define the angle preferably within a range from 85° to 95° and, more preferably, within a range from 87° to 93°.

Then, after forming an Si oxide film 705 of 100 nm thickness over the entire surface, phosphorus (P) was implanted over the entire surface by an ion implantation method. In this embodiment, the dose energy of phosphorus was set to 120 keV and the dose amount thereof was set to 2e15/cm$^2$. Under the ion implantation condition of phosphorus, since the maximum concentration of phosphorus is at a depth of about 120 nm form the uppermost surface of the Si oxide film, phosphorus is ion implanted in the polycrystal Si film in a planar portion to form amorphous Si films 706($a$) and 706($b$).

Figure 19B:
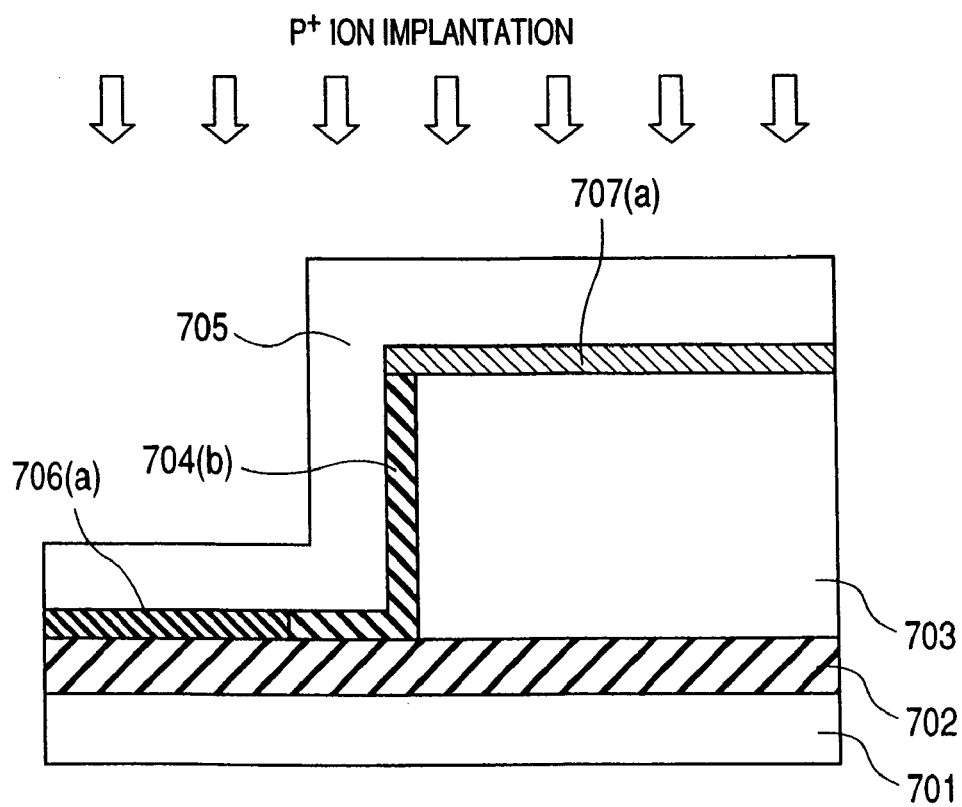

On the other hand, for the ion implantation, phosphorus is not implanted into the side wall of the Si oxide film 703 of 500 nm thickness, where the thickness of the Si oxide film 705 at the uppermost layer is substantially increased and in the polycrystal Si film 704($b$) near the bottom at the step of the Si oxide film 703. Referring to FIG. 19B, the polycrystal Si film 704($b$) in a region of an inversed L configuration at the step side wall and the bottom thereof of the Si oxide film 703 is a non-doped polycrystal Si film 704($b$) not implanted with phosphorus.

Figure 20A:
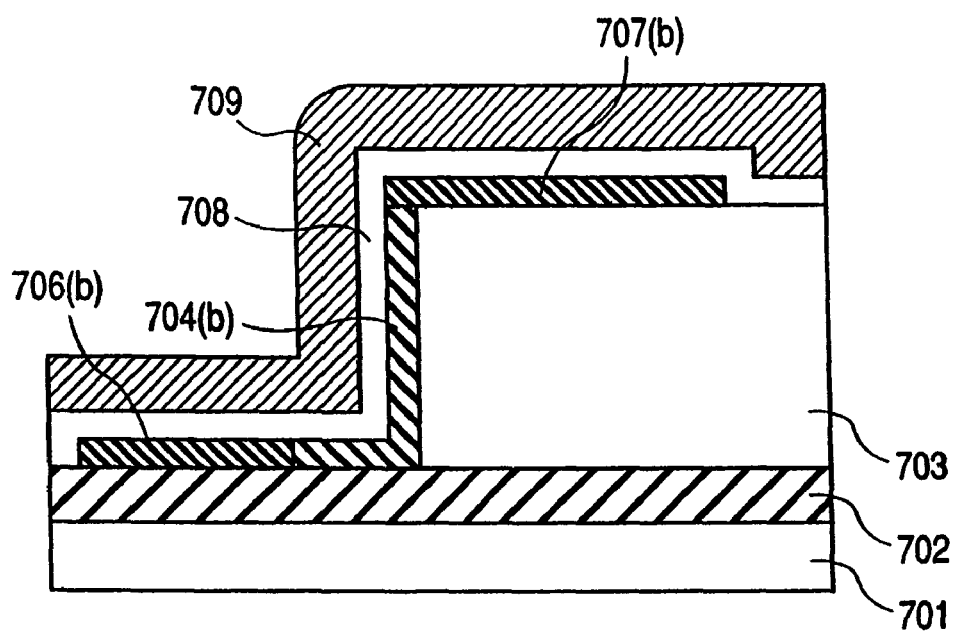
FIG. 20A and FIG. 20B are cross sectional views of a specimen for explaining embodiment 6 of the invention.

Successively, the carbonic acid gas laser and the UV light were irradiated over the entire surface to crystallize the amorphous Si regions 706($a$) and 707($a$) implanted with phosphorus by ion implantation. By the heat treatment, the amorphous Si regions 706($b$) and 707($a$) are transformed into phosphorus-doped polycrystal Si films 706($b$) and 707($b$). The phosphorus-doped polycrystal Si film forms the source 706($b$) and the drain 707($b$) of the polycrystal Si-TFT manufactured in this embodiment. Then, after entirely removing the Si oxide film 705 used as a mask for ion implantation with an aqueous HF solution to expose the surfaces of the polycrystal Si films 704($b$), 706($b$), and 707($b$), the polycrystal Si film 704($b$), 706($b$) and 707($b$) were fabricated each into a predetermined shape by using lithography and isotropic dry etching technique. Specifically, they were fabricated into the shape of a rectangle 704 shown by broken line in FIG. 22A. Then, an Si oxide film 708 of 50 nm as a gate insulator 708 and a tungsten film of 100 nm as a gate electrode 709 were formed successively (FIG. 20A).

Figure 20B:
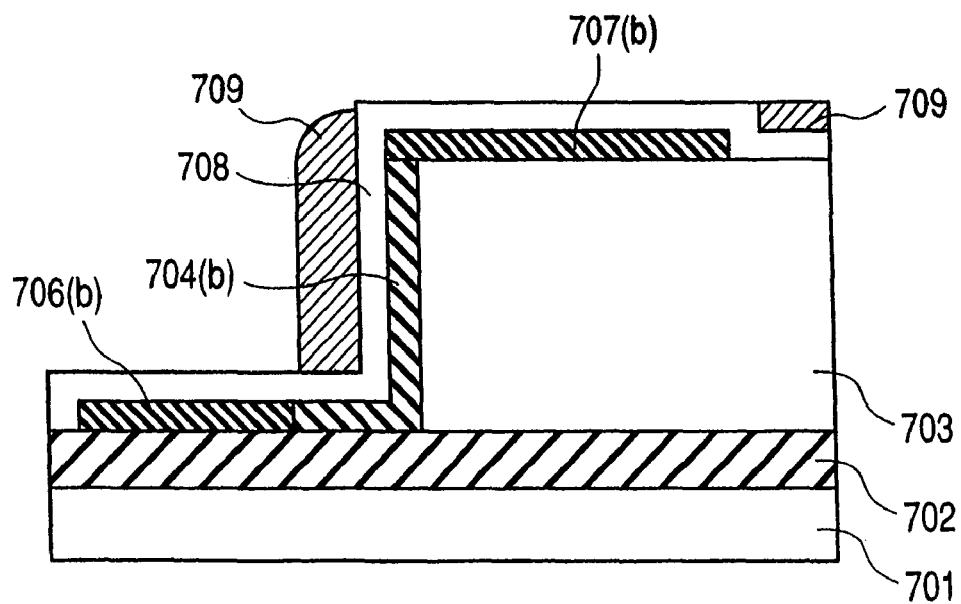
Figure 21A:
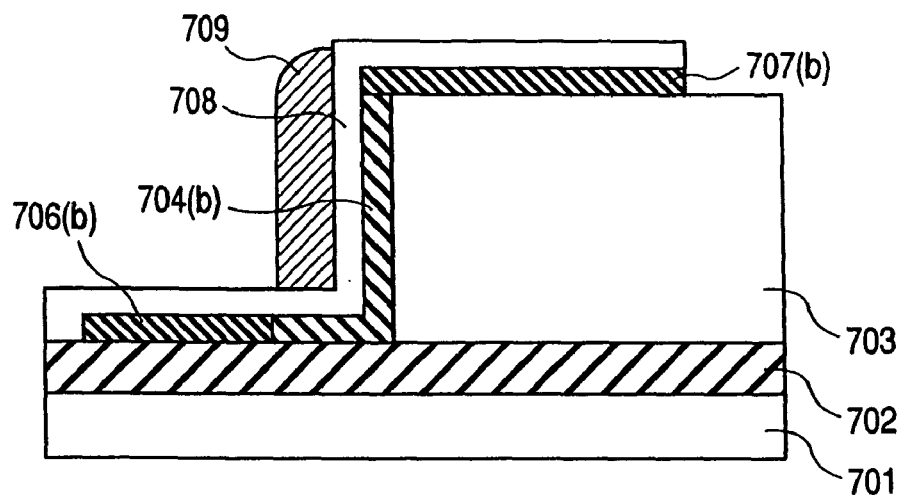
FIG. 21A and FIG. 21B are cross sectional views of a specimen for explaining embodiment 6 of the invention.
Figure 22A:
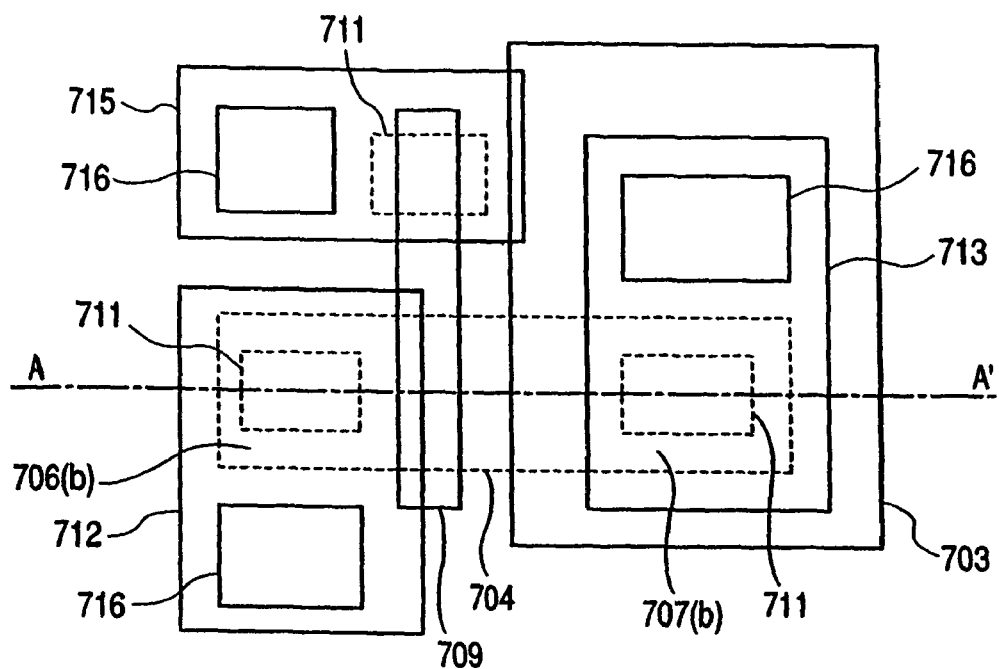
FIG. 22A and FIG. 22B are a plan view and a cross sectional view of a specimen for explaining embodiment 6 of the invention.

Then, the tungsten film 709 was entire etched by an anisotropic dry etching method. As shown in FIG. 20B, when the anisotropic dry etching is conducted, a spacer 709 of tungsten at a thickness equal with the thickness formed on the lateral wall of the underlying step is formed. Successively, after forming a predetermined resist mask by lithographic technique, the tungsten film for an unnecessary portion was removed by anisotropic dry etching. As shown in FIG. 21A, the tungsten spacer 709 was formed by the etching only in a desired region. Specifically as shown in FIG. 22A, the tungsten spacer 709 was left only at a desired lateral wall portion of the Si oxide film 703 to form the gate electrode 709.

Figure 21B:
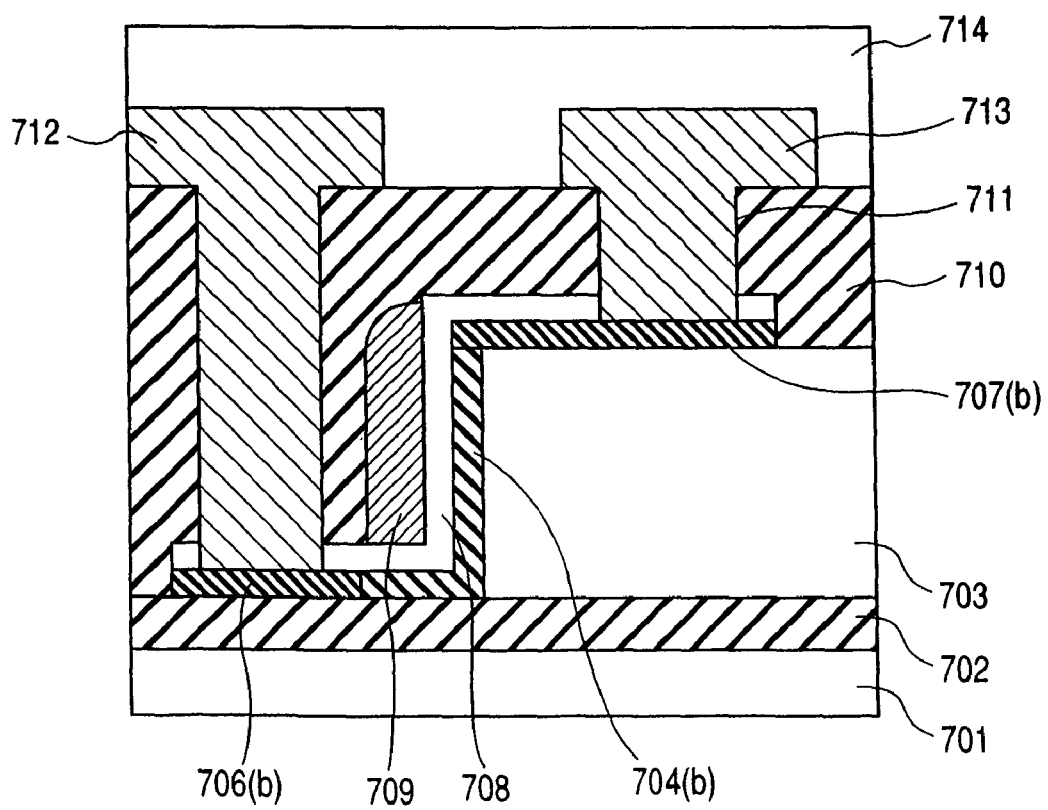
Figure 22B:
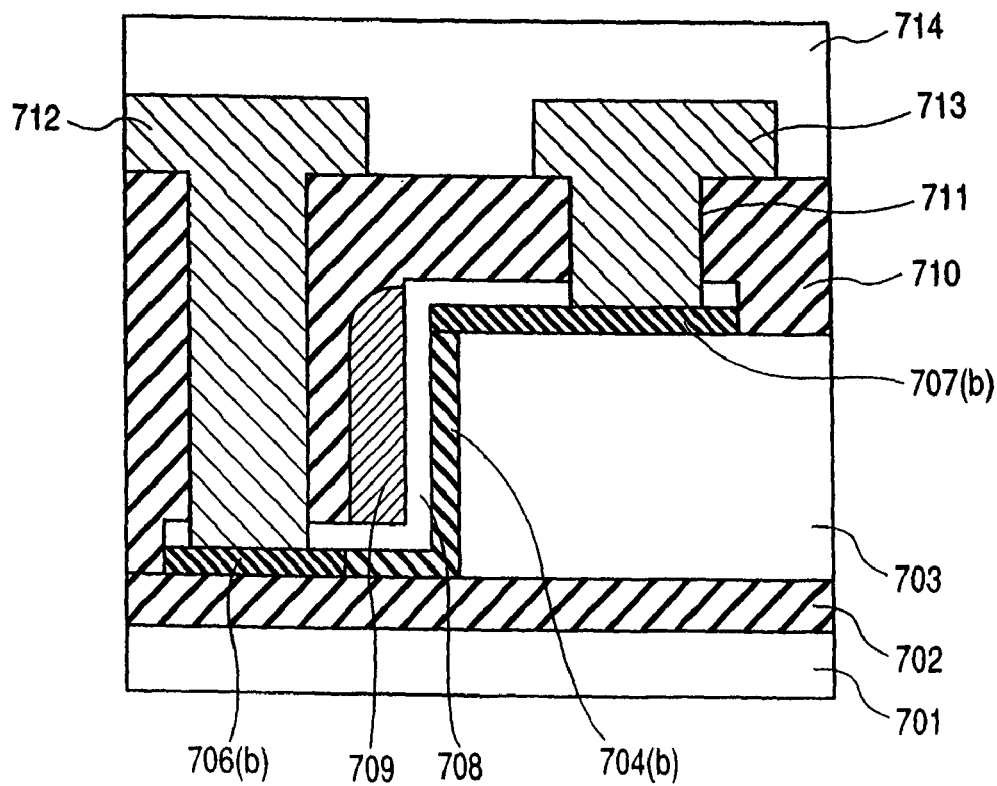
Figure 23:
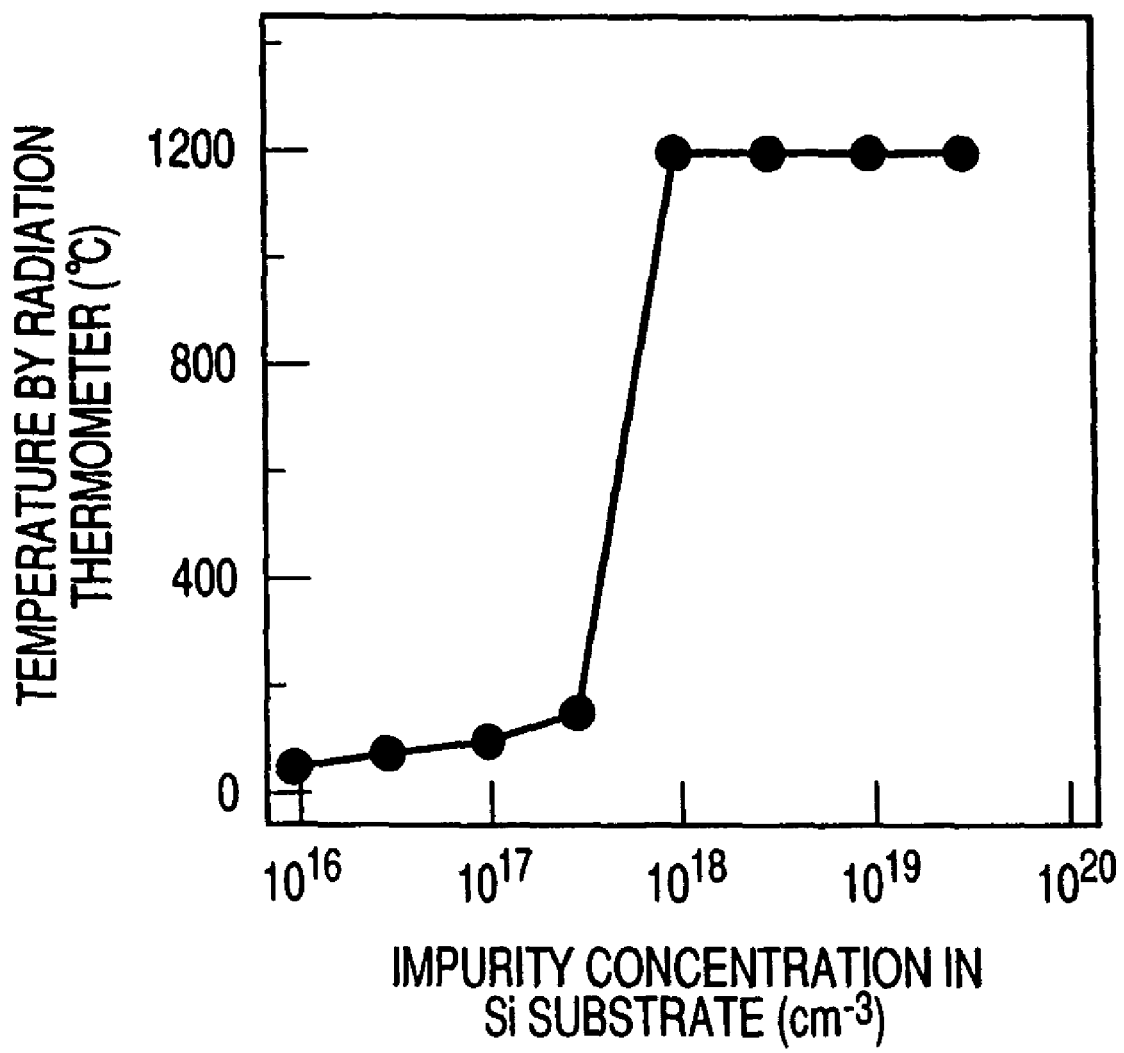
FIG. 23 is a view showing a relation between the concentration of impurity and temperature of Si in the invention discussed previously.
Figure 24:
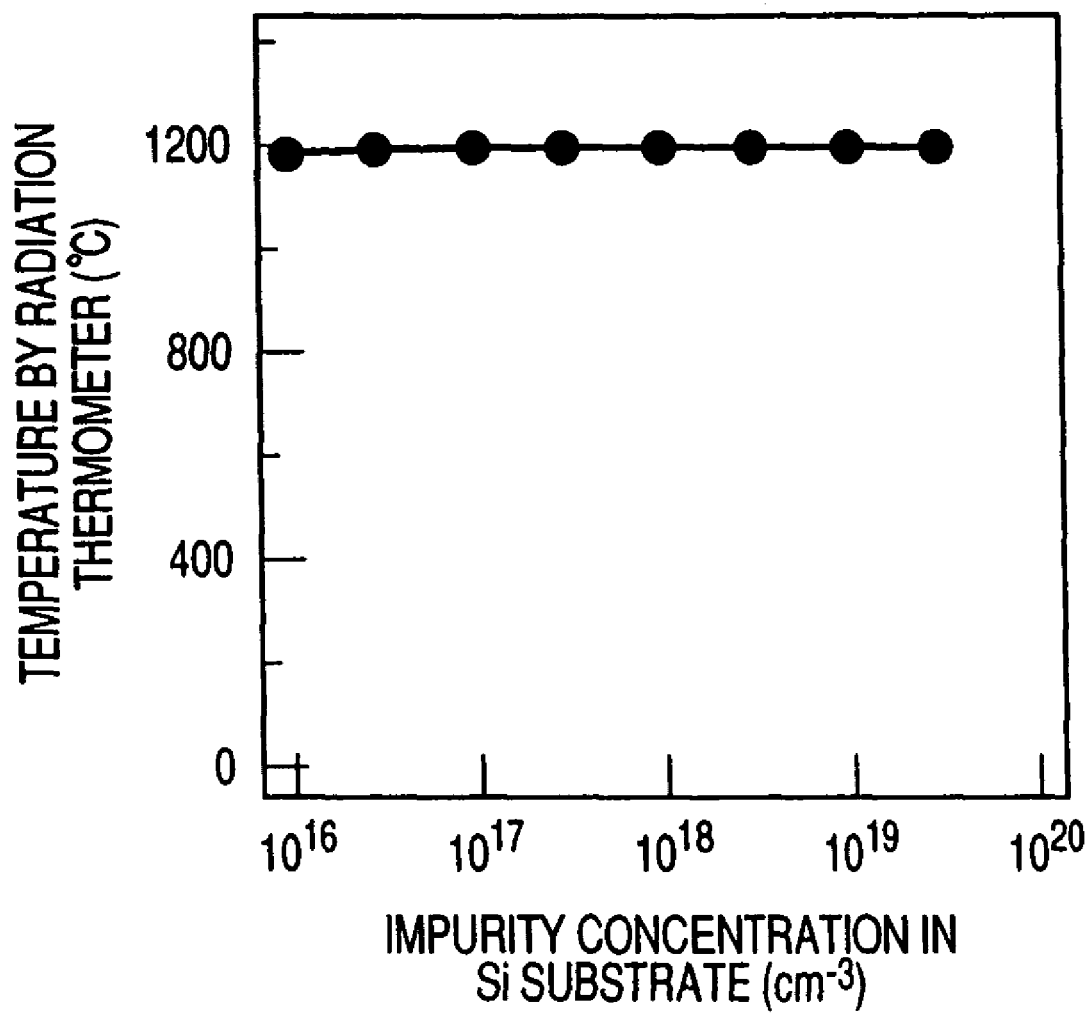
FIG. 24 is a view showing a relation between the concentration of impurity and temperature of Si in the invention discussed previously.
Figure 25A:
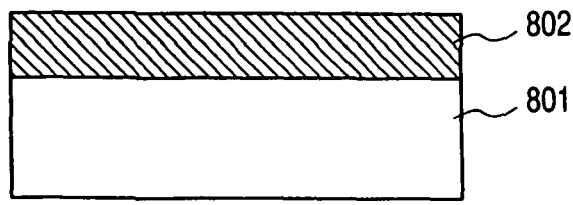
FIG. 25A, FIG. 25B, FIG. 25C, and FIG. 25D are schematic views for crystallization of amorphous Si by an existent excimer laser.
Figure 25B:
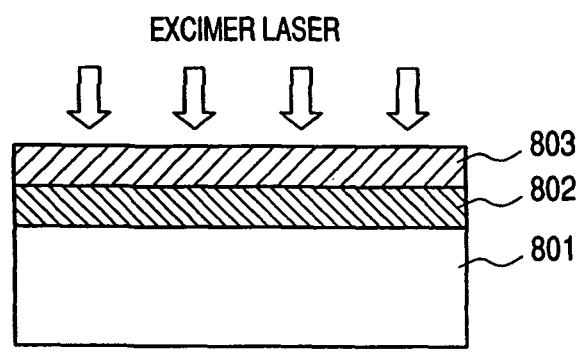
Figure 25C:
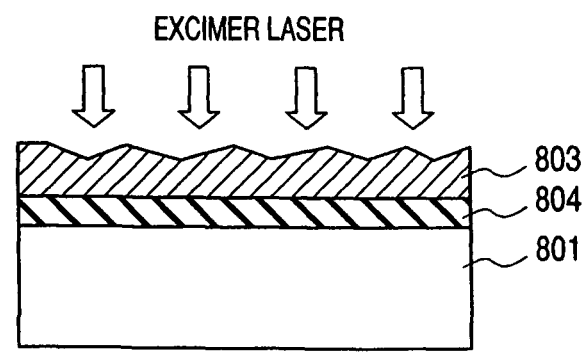
Figure 25D:
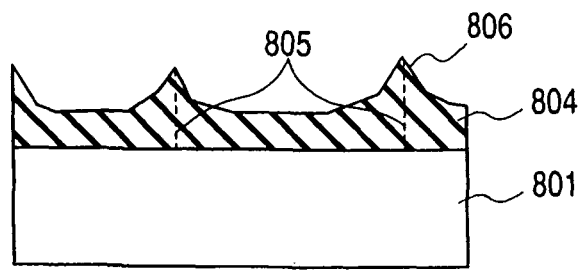

Then, after forming an Si oxide film 710 of 1000 nm thickness as the interlayer dielectric film, openings 711 to expose a portion of the source region 706($b$) and the drain region 707($b$) of the polycrystal Si-TFT were formed by lithography and dry etching method. Successively, by using the same method as in embodiment 5, after continuously forming a lamination film comprising titanium (Ti), titanium nitride (TiN), and aluminum (Al), they were fabricated each into a predetermined shape as a source interconnection 712, a drain interconnection 713, and a gate interconnection 715. Then, by a plasma CVD method, an Si nitride film 714 of 200 nm thickness was formed to form openings 716 to expose the surface of the aluminum interconnection (FIG. 21B, FIGS. 22A and 22B).

Finally, a heat treatment for 30 min was conducted in a nitrogen atmosphere at 400° C. to complete manufacture of the polycrystal Si-TFT of the invention. As shown in FIG. 22, the polycrystal Si-TFT manufactured in this example has a device structure in which the channel was formed vertically utilizing the side wall portion of the underlying Si oxide film 703. Since this is a structure in which the channel length (L) is determined by the thickness of the underlying Si oxide film 703 and the spacer length of the gate electrode 709, a polycrystal Si transistor having an extremely short channel length not depending on the minimum feature size of lithography can be manufactured. In this embodiment, while the polycrystal Si-TFT was manufactured by utilizing only one side wall of the underlying Si oxide film 703, the polycrystal Si-TFT can of course be manufactured also on the side wall on the opposite side wall.

Also in this embodiment, the sheet resistance, the gate dielectric breakdown withstand voltage and the variation thereof were evaluated by the same method as in embodiment 5. As a result, characteristics substantially identical with those of specimen #3 shown in embodiment 5 were obtained.

That is, a device of high gate dielectric withstand voltage and with low sheet resistance was obtained irrespective of the device structure of polycrystal Si by crystallizing the channel Si layer and activating the source and the drain by the carbonic acid gas laser annealing.

While the invention made by the present inventors has been described specifically with reference to embodiments, the invention is not restricted to each of the embodiments described above and can be modified variously within a range not departing from the gist of the invention.

Further, the crystallization of the semiconductor material and the activation of the impurity by the carbonic acid gas laser and light irradiation of the invention is applicable not only to the case where the underlying substrate is made of glass but also to a case of formation above the resin substrate or the resin film.

What is claimed is:

1. A display device having a thin film semiconductor device including a semiconductor thin film having first and second semiconductor regions formed each into a predetermined shape above an insulative substrate, a conductor fabricated into a predetermined shape to the semiconductor thin film and a dielectric film put between the semiconductor thin film and the conductor, wherein the semiconductor thin film is a polycrystal thin film with a crystallization ratio thereof exceeding 90% and a difference of unevenness on a surface of the semiconductor thin film does not exceed 10 nm.

2. A display device having a thin film semiconductor device according to claim 1, wherein the semiconductor thin film is a polycrystal thin film with a mobility of 10 cm$^2$/V·s or more.

3. A display device having a thin film semiconductor device according to claim 1, wherein the semiconductor thin film has first and second semiconductor regions each fabricated into a predetermined shape on at least a portion of the side wall portion of a first dielectric film fabricated into a predetermined shape on the insulative substrate, and has a second dielectric film put between conductors fabricated into a predetermined shape, and wherein the difference of unevenness on the surface of the semiconductor thin film is 10 nm or less.

4. A display device having a thin film semiconductor device according to claim 3, wherein the first and second semiconductor regions of the semiconductor thin film comprise N-type or P-type polycrystal thin films and the sheet resistance of the region is 1 kΩ/Q or less.

5. A display device having a thin film semiconductor device according to claim 3, wherein the semiconductor device is a thin film transistor in which the first and second semiconductor regions of the semiconductor thin film each fabricated into the predetermined shape is a source or a drain, the conductor fabricated into the predetermined shape is a gate electrode and the dielectric film put between the semiconductor thin film and the conductor is a gate insulator.

6. A display device having a thin film semiconductor device according to claim 1, wherein the semiconductor thin film comprises one of polycrystal Si film, polycrystal SiGe film, and polycrystal SiC film.

7. A display device having a thin film semiconductor device according to claim 2, wherein the semiconductor thin film comprises one of polycrystal Si film, polycrystal SiGe film, and polycrystal SiC film.

8. A display device having a thin film semiconductor device according to claim 3, wherein the semiconductor thin film comprises one of polycrystal Si film, polycrystal SiGe film, and polycrystal SiC film.

* * * * *